United States Patent
Osano et al.

(10) Patent No.: US 7,965,539 B2
(45) Date of Patent: Jun. 21, 2011

(54) NONVOLATILE MEMORY ELEMENT, NONVOLATILE SEMICONDUCTOR MEMORY APPARATUS, AND READING METHOD AND WRITING METHOD THEREFOR

(75) Inventors: Koichi Osano, Osaka (JP); Shunsaku Muraoka, Osaka (JP); Satoru Fujii, Osaka (JP); Kazuhiko Shimakawa, Osaka (JP)

(73) Assignee: Panasonic Corporation, Osaka (JP)

( * ) Notice: Subject to any disclaimer, the term of this patent is extended or adjusted under 35 U.S.C. 154(b) by 232 days.

(21) Appl. No.: 12/516,703

(22) PCT Filed: Sep. 25, 2008

(86) PCT No.: PCT/JP2008/002657
§ 371 (c)(1),
(2), (4) Date: May 28, 2009

(87) PCT Pub. No.: WO2009/041041
PCT Pub. Date: Apr. 2, 2009

(65) Prior Publication Data
US 2010/0271859 A1    Oct. 28, 2010

(30) Foreign Application Priority Data

Sep. 28, 2007 (JP) ................. 2007-253331

(51) Int. Cl.
*G11C 11/00* (2006.01)
(52) U.S. Cl. .......... 365/148; 365/100; 365/189.011
(58) Field of Classification Search .......... 365/148, 365/100, 163, 189.011; 257/4, E21.35
See application file for complete search history.

(56) References Cited

U.S. PATENT DOCUMENTS

| 6,473,332 | B1 | 10/2002 | Ignatiev et al. | |
| 7,145,791 | B2* | 12/2006 | Tsushima et al. | 365/148 |
| 2006/0002174 | A1* | 1/2006 | Hosoi et al. | 365/148 |
| 2007/0159869 | A1* | 7/2007 | Baek et al. | 365/148 |

FOREIGN PATENT DOCUMENTS

| JP | 2007-027537 | 2/2007 |
| JP | 2007-188603 | 7/2007 |
| JP | 2007-235139 | 9/2007 |
| WO | WO 2007/013174 A1 | 2/2007 |
| WO | WO 2008/059701 A1 | 5/2008 |
| WO | WO 2008/126365 A1 | 10/2008 |

OTHER PUBLICATIONS

Zhuang, W.W., et al., Novell Colossal Magnetoresistive Thin Film Nonvolatile Resistance Random Access Memory (RRAM), Int. Electron Devices Meet., 2002, pp. 193-196.

* cited by examiner

*Primary Examiner* — Tuan T Nguyen
*Assistant Examiner* — Toan Le
(74) *Attorney, Agent, or Firm* — McDermott Will & Emery LLP

(57) ABSTRACT

A nonvolatile memory element (101) of the present invention includes a resistance variable layer (112) which intervenes between a first electrode (111) and a second electrode (113) and is configured to include at least an oxide of a metal element of VI group, V group or VI group, and when an electric pulse of a specific voltage is applied between the first voltage (111) and the second voltage (113), the resistance variable layer is turned to have a first high-resistance state or a second high-resistance state in which its resistance value is a high-resistance value $R_H$, or a low-resistance state in which its resistance value is a low-resistance value $R_L$.

15 Claims, 17 Drawing Sheets

SELECTION ROW ELECTRIC POWER SUPPLY CIRCUIT (a)

NON-SELECTION ROW ELECTRIC POWER SUPPLY CIRCUIT (b)

SELECTION COLUMN ELECTRIC POWER SUPPLY CIRCUIT (c)

NON-SELECTION COLUMN ELECTRIC POWER SUPPLY CIRCUIT (d)

US 7,965,539 B2

NONVOLATILE MEMORY ELEMENT, NONVOLATILE SEMICONDUCTOR MEMORY APPARATUS, AND READING METHOD AND WRITING METHOD THEREFOR

RELATED APPLICATIONS

This application is the U.S. National Phase under 35 U.S.C. §371 of International Application No. PCT/JP2008/002657, filed on Sep. 25, 2008, which in turn claims the benefit of Japanese Application No. 2007-253331, filed on Sep. 28, 2007, the disclosures of which Applications are incorporated by reference herein.

TECHNICAL FIELD

The present invention relates to a nonvolatile memory element and non volatile semiconductor memory apparatus which use a state variable material whose resistance value changes according to pulse voltages applied, and a reading method and writing method therefor.

BACKGROUND ART

In recent years, with advancement of digital technologies of electronic devices, there has been an increasing need for nonvolatile memory elements which are capable of preserving huge amount of data of images or moving pictures in a state where an electric power supply is in an off state. Patent document 1 and Non-patent document 1 disclose, in response to such a need, a technique in which the nonvolatile memory elements are formed using perovskite materials (e.g., Pr(1−x)CaxMnO3(PCMO), LaSrMnO3(LSMO), GdBaCoxOy (GBCO), etc) whose resistance values change according to electric pulses applied, state variable materials (hereinafter referred to as resistance variable materials) whose resistance values change are applied with predetermined electric pulses to increase or decrease the resistance values, and the resulting states having changed different plural resistance values are used to store numeric values, thus using the nonvolatile memory elements as multi-valued memory elements.

Patent document 1: U.S. Pat. No. 6,473,332 specification
Non-patent document 1: Tech. Dig.-Int. Electron Devices Meet. 2002, W. W. Zuang et al.

DISCLOSURE OF THE INVENTION

Problems to be Solved by the Invention

Patent document 1 and Non-patent document 1 disclose a technique in which the nonvolatile memory element includes a pair of electrodes and multi-valued (more than 1 bit) data is stored using the material whose resistance value changes according to electric pulses applied between electrodes, for example, the perovskite material such as PCMO.

For example, FIG. 18 is a view showing an example of a change in resistance according to electric pulses which is disclosed in Patent document 1. An electric pulse having a predetermined polarity, a predetermined voltage and a predetermined pulse width is applied a predetermined number of times to an element which has been applied with a reset pulse, increasing or decreasing the resistance value. The resulting states having different resistance values are selected and are caused to correspond to distinguished numeric values. In the states having different resistances values, the resistance values need to have a large difference between them so that these resistance values read out are distinguishable. However, even when the electric pulse having an equal voltage, and an equal pulse width is applied with an equal number of times, the resulting resistance value does not always match a desired resistance value with high reproducibility. If the difference between the resistance values is small, state stability is not sufficiently high. In some cases, due to change in temperature and others, the set resistance values change to ones which may be regarded as another states. Thus, there has been a problem that the nonvolatile memory element is difficult to operate stably as the nonvolatile memory element for storing the multi-valued data.

The present invention has been made in view of the aforesaid circumstances, and an object of the present invention is to provide a nonvolatile memory element and nonvolatile semiconductor memory apparatus which are capable of stably reading and writing multi-valued data, and a reading method and writing method therefor.

Means for Solving the Problems

To solve the above described problem, the inventors intensively studied to operate a nonvolatile memory element such that the nonvolatile memory element is writable to three or more distinguishable states with high reproducibility, has sufficiently stable states, and is stable as a multi-valued nonvolatile memory element.

As a result, it was found that with the configuration and method described below, the problems can be solved.

A nonvolatile memory element of the present invention comprises a first electrode; a second electrode; and a resistance variable layer which intervenes between the first electrode and the second electrode, a resistance value of the resistance variable layer changing reversibly in response to electric pulses applied between the first electrode and the second electrode; wherein the resistance variable layer is configured to include at least an oxide of a metal element of IV group, V group or VI group; wherein when among voltages V1 to V6 of the electric pulses applied between the first electrode and the second electrode, the voltage V1, the voltage V4 and the voltage V6 are positive voltages and have a relationship V1>V4>V6, and the voltage V2, the voltage V3, and the voltage V5 are negative voltages and have a relationship V5>V3>V2, (A) the resistance value of the resistance variable layer becomes a high-resistance value $R_H$ when the electric pulse of the voltage V1 is applied between the first electrode and the second electrode, thereafter the resistance value maintains the high-resistance value $R_H$ when an electric pulse of a positive voltage is applied between the first electrode and the second electrode, while the resistance value decreases when an electric pulse of a negative voltage which is smaller than the voltage V5 and larger than the voltage V3 is applied between the first electrode and the second electrode, the resistance value becomes a low-resistance value $R_L$ when the electric pulse of the voltage V3 is applied between the first electrode and the second electrode, then increases when an electric pulse of a negative voltage which is smaller than the voltage V3 and larger than the voltage V2 is applied between the first electrode and the second electrode, or becomes the high-resistance value $R_H$ when the electric pulse of the voltage V2 is applied between the first electrode and the second electrode, (B) after the electric pulse of the voltage V2 is applied between the first electrode and the second electrode, the resistance value maintains the high-resistance value $R_H$ when an electric pulse of a negative voltage is applied between the first electrode and the second electrode, while the resistance value decreases when an electric pulse of a positive voltage which is larger than the voltage V6 and smaller than the voltage V4 is applied between the first electrode and the second electrode, the resistance value becomes the low-resistance value $R_L$ when the electric pulse of the voltage V4 is applied between the first electrode and the second electrode, and then increases when an electric pulse of a positive voltage which is larger than the voltage V4 and smaller than the voltage V1 is applied between the first electrode and the second electrode, or becomes the high-resistance value $R_H$ when the electric pulse of the voltage V1 is applied between the first electrode and the second electrode.

A writing method of a nonvolatile memory element of the present invention is a writing method of the nonvolatile memory element according to the above invention, comprises the steps of: applying the electric pulse of the voltage V1 between the first electrode and the second electrode to generate a first high-resistance state in which the resistance value of the resistance variable layer is the high-resistance value $R_H$; applying the electric pulse of the voltage V2 between the first electrode and the second electrode to generate a second high-resistance state in which the resistance value of the resistance variable layer is the high-resistance value $R_H$; and applying the electric pulse of the voltage V3 between the first electrode and the second electrode in the first high-resistance state or applying the electric pulse of the voltage V4 between the first electrode and the second electrode in the second high-resistance state to generate a low-resistance state in which the resistance value of the resistance variable layer is the low-resistance value $R_L$.

A reading method of the nonvolatile memory element of the present invention is a reading method of the nonvolatile memory element, for reading data written according to the writing method of the nonvolatile memory element according to the above invention, comprises a first step for applying an electric pulse for a read voltage which is larger than the voltage V5 and smaller than the voltage V6 between the first electrode and the second electrode to determine whether the resistance state of the resistance variable layer is the high-resistance state in which the resistance value thereof is the high-resistance value $R_H$ or the low-resistance state; a second step for applying the electric pulse of the voltage V4 between the first electrode and the second electrode when it is determined that the resistance state of the resistance variable layer is the high-resistance state in the first step; and a third step for applying the electric pulse for the read voltage between the first electrode and the second electrode to determine whether the resistance state of the resistance variable layer is the high-resistance state or the low-resistance state, after the second step.

It is preferable that the reading method of the nonvolatile memory element according to the above invention may further comprise a fourth step for applying the electric pulse of the voltage V2 between the first electrode and the second electrode, when it is determined that the resistance state of the resistance variable layer is the low-resistance state in the third step.

A reading method of the nonvolatile memory element of the present invention is a reading method of the nonvolatile memory element for reading data written according to the writing method of the nonvolatile memory element according to the above invention, comprises a first step for applying an electric pulse for a read voltage which is larger than the voltage V5 and smaller than the voltage V6 between the first electrode and the second electrode to determine whether the resistance state of the resistance variable layer is the high-resistance state in which the resistance value thereof is the high-resistance value $R_H$ or the low-resistance state; and a step for applying the electric pulse for the read voltage between the first electrode and the second electrode and further applying an electric pulse of a voltage which is different in polarity from the read voltage and is equal in absolute value to the read voltage to determine whether the resistance state of the resistance variable layer is the first high-resistance state or the second high-resistance state, when it is determined that the resistance state of the resistance variable layer is the high-resistance state in the first step.

A nonvolatile memory element of the present invention comprise N (N≧3) electrodes; and a resistance variable layer which intervenes between the electrodes, a resistance value of the resistance variable layer changing reversibly in response to electric signals applied between the electrodes; wherein the resistance variable layer is configured to include at least an oxide of a metal element of IV group, V group or VI group; wherein when among voltages V1 to V6 of the electric pulses applied between the electrodes, the voltage V1, the voltage V4 and the voltage V6 are positive voltages and have a relationship V1>V4>V6, and the voltage V2, the voltage V3, and the voltage V5 are negative voltages and have a relationship V5>V3>V2, (A) the resistance value of the resistance variable layer becomes a high-resistance value $R_H$ when the electric pulse of the voltage V1 is applied between the electrodes, thereafter the resistance value maintains the high-resistance value $R_H$ when an electric pulse of a positive voltage is applied between the electrodes, while the resistance value decreases when an electric pulse of a negative voltage which is smaller than the voltage V5 and larger than the voltage V3 is applied between the electrodes, the resistance value becomes a low-resistance value $R_L$ when the electric pulse of the voltage V3 is applied between the electrodes, then increases when an electric pulse of a negative voltage which is smaller than the voltage V3 and larger than the voltage V2 is applied between the electrodes, or becomes the high-resistance value $R_H$ when the electric pulse of the voltage V2 is applied between the electrodes, (B) after the electric pulse of the voltage V2 is applied between the electrodes, the resistance value maintains the high-resistance value $R_H$ when an electric pulse of a negative voltage is applied between the electrodes, while the resistance value decreases when an electric pulse of a positive voltage which is larger than the voltage V6 and smaller than the voltage V4 is applied between the electrodes, the resistance value becomes the low-resistance value $R_L$ when the electric pulse of the voltage V4 is applied between the electrodes, and then increases when an electric pulse of a positive voltage which is larger than the voltage V4 and smaller than the voltage V1 is applied between the electrodes, or becomes the high-resistance value $R_H$ when the electric pulse of the voltage V1 is applied between the electrodes.

A writing method of the nonvolatile memory element of the present invention is a writing method of the nonvolatile memory element according to the above invention, comprise the steps of: applying the electric pulse of the voltage V1 between the electrodes to generate a first high-resistance state in which the resistance value of the resistance variable layer is the high-resistance value $R_H$; applying the electric pulse of the voltage V2 between the electrodes to generate a second high-resistance state in which the resistance value of the resistance variable layer is the high-resistance value $R_H$; and applying the electric pulse of the voltage V3 between the electrodes in the first high-resistance state or applying the electric pulse of the voltage V4 between the electrodes in the second high-resistance state, to generate the low-resistance state in which the resistance value of the resistance variable layer is the low-resistance value $R_L$.

A nonvolatile semiconductor memory apparatus of the present invention comprises a semiconductor substrate; a plurality of memory cells including a plurality of word lines and a plurality of bit lines which are provided on the semiconductor substrate such that the word lines and the bit lines are arranged in matrix to cross each other, a plurality of transistors provided to respectively correspond to cross points between the plurality of word lines and the plurality of bit lines, and a plurality of nonvolatile memory elements according to Claim 1 which are provided to respectively correspond to the plurality of transistors; a row selection circuit for selecting one of the plurality of word lines; a column selection circuit for selecting one of the plurality of bit lines; a N-bit data input/output circuit which performs inputting and outputting data to and from an external part of the semiconductor substrate in a binary form of a high level or a low level; a data encoding circuit for converting N-bit input data which is sent from the data input/output circuit into M ($2N \leq 3M$)-bit data expressing three values; a reference voltage source connected to one terminal of the nonvolatile memory element; a first voltage source which is connected to the other terminal of the nonvolatile memory element and writes a first high-resistance state in which the resistance value of the nonvolatile memory element is a high-resistance value $R_H$; a second voltage source which is connected to the other terminal of the nonvolatile memory element and writes a second high-resistance state in which the resistance value of the nonvolatile memory element is a high-resistance value $R_H$; a third voltage source which is connected to the other terminal of the nonvolatile memory element and writes a low-resistance state in which the resistance value of the nonvolatile memory element is a low-resistance value $R_L$; a sense amplifier circuit configured to determine whether the resistance value of the nonvolatile memory element is higher or lower than a predetermined value; and a data decoding circuit for converting M-bit data expressing three values into N-bit binary data, to output write data for the memory cell through the data input/output circuit; wherein the N-bit input data are stored in M memory cells.

A reading method of the nonvolatile semiconductor memory apparatus of the present invention is a reading method of the nonvolatile semiconductor memory apparatus according to the above invention, comprises a first step for determining whether the resistance value of the selected memory cell is higher or lower than a predetermined value, using the sense amplifier; a second step for determining using the sense amplifier again whether the resistance value of the selected memory cell is higher or lower than the predetermined value after performing writing using the third voltage source, when it is determined that the resistance value is higher than the predetermined value in the first step; a third step for determining that the low-resistance state has been written in the selected memory cell when it is determined that the resistance value is lower than the predetermined value in the first step; a fourth step for determining that the first high-resistance state has been written in the selected memory cell when it is determined that the resistance value is lower than the predetermined value in the second step; and a fifth step for determining that the second high-resistance state has been written in the selected memory cell when it is determined that the resistance value is higher than the predetermined value in the second step.

It is preferable that in the reading method of the nonvolatile semiconductor memory apparatus according to the above invention, when it is determined that the resistance value is lower than the predetermined value in the second step, writing is performed using the first voltage source or the second voltage source so that the nonvolatile memory element becomes the resistance state in the first step.

A writing method of the nonvolatile semiconductor memory apparatus of the present invention is a writing method of the nonvolatile semiconductor memory apparatus according to the above invention, comprises a first step for writing to the selected memory cell using the first voltage source or the second voltage source to set the resistance state of the memory cell in a predetermined resistance state; and a second step for writing using the first voltage source, writing using the second voltage source, or writing using the third voltage source, after the first step.

It is preferable that in the writing method of the nonvolatile semiconductor memory apparatus according to the above invention, when the resistance state set in the first step is identical to the resistance state to be written in the second step, the second step is not performed.

A nonvolatile semiconductor memory apparatus of the present invention comprises a semiconductor substrate; and a memory cell array including a plurality of first electrode wires provided to extend in parallel with each other on the semiconductor substrate, a plurality of second electrode wires which are provided above the plurality of first electrode wires and are arranged to extend in parallel with each other and to three-dimensionally cross the plurality of the first electrode wires within a plane parallel to a main surface of the semiconductor substrate, and nonvolatile memory elements according to the above invention provided to respectively correspond to three-dimensional cross points between the plurality of first electrode wires and the plurality of second electrode wires.

It is preferable that in the nonvolatile memory element according to the above invention, the oxide of the metal element of the IV group, the V group or the VI group is an oxide which is selected from among Ti (titanium), V (vanadium), Zr (zircon), Nb (niobium), Hf (hafnium), Ta (tantalum) and W (tungsten).

It is preferable that in the nonvolatile memory element according to the above invention, the oxide of the metal element of the IV group, the V group or the VI group is a tantalum oxide which satisfies $0<x<2.5$ when the tantalum oxide is expressed as $TaO_x$.

The above and further objects, features and advantages of the invention will more fully be apparent from the following detailed description with accompanying drawings.

Effects of the Invention

In accordance with the nonvolatile memory element and nonvolatile semiconductor memory apparatus according to the present invention, it is possible to attain a multi-valued memory which is capable of stably storing data which is more than 1 bit.

In addition, in accordance with a reading method and writing method of the nonvolatile memory element and nonvolatile semiconductor memory apparatus according to the present invention, data can be read and written stably.

BRIEF DESCRIPTION OF THE DRAWINGS

FIG. 4 is a cross-sectional view schematically showing a structure of regions in the vicinity of interfaces between a resistance variable layer and both electrodes which are included in the nonvolatile memory element according to Embodiment 1 of the present invention, wherein FIG. 4(a) is a view showing a structure in a high-resistance state (S1) of FIG. 3, FIG. 4(b) is a view showing a structure in a high-resistance state (S2) of FIG. 3, and FIG. 4(c) is a view showing a structure in a low-resistance state (S3) and a low-resistance state (S4) of FIG. 3.

Figure 1:
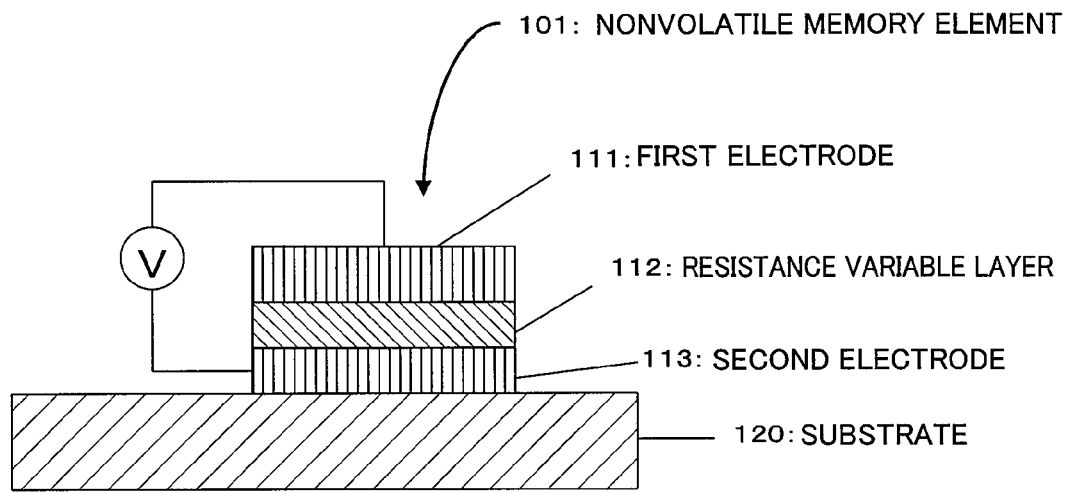
FIG. 1 is a cross-sectional view showing an example of a structure of a nonvolatile memory element according to Embodiment 1 of the present invention.

DESCRIPTION OF REFERENCE NUMERALS 101 nonvolatile memory element
111, 113, 115, 120, 121 electrode
112, 114, 122 resistance variable layer
116, 117, 118, 119 interface with electrode
120 substrate

BEST MODE FOR CARRYING OUT THE INVENTION

Hereinafter, preferred embodiments of the present invention will be described with reference to the drawings.

Embodiment 1

FIG. 1 is a cross-sectional view showing an example of a structure of a nonvolatile memory element according to Embodiment 1 of the present invention. As shown in FIG. 1, a nonvolatile memory element 101 of present embodiment has a structure in which a resistance variable layer 112 made of a resistance variable material is sandwiched between a first electrode 111 and a second electrode 113, and is provided on a substrate 120. By applying electric pulses each having a predetermined polarity, a predetermined voltage and a predetermined width between the first electrode 111 and the second electrode 113, the resistance value of the element can be changed to plural different constant resistance values with high reproducibility. The changed states can be kept for a sufficiently long time. Therefore, by respectively corresponding the plural different states to plural values, the nonvolatile memory element is operable as a memory element which is capable of storing multi-valued data.

The resistance variable element 112 is formed of a tantalum oxide as a resistance variable material. The tantalum oxide satisfies 0<x<2.5 when it is expressed as $TaO_x$. The thickness of the resistance variable layer 112 may be set to, for example, 20 nm. The substrate 120 may be, but are not limited to, a silicon single crystal substrate or a semiconductor substrate. As an electrode material for the first electrode 111 and the second electrode 113, Pt (platinum) is used. The thickness of the electrodes may be set to, for example, 200 nm, and the size of the electrodes may be set to, for example, about 3 $\mu m^2$.

Figure 2:
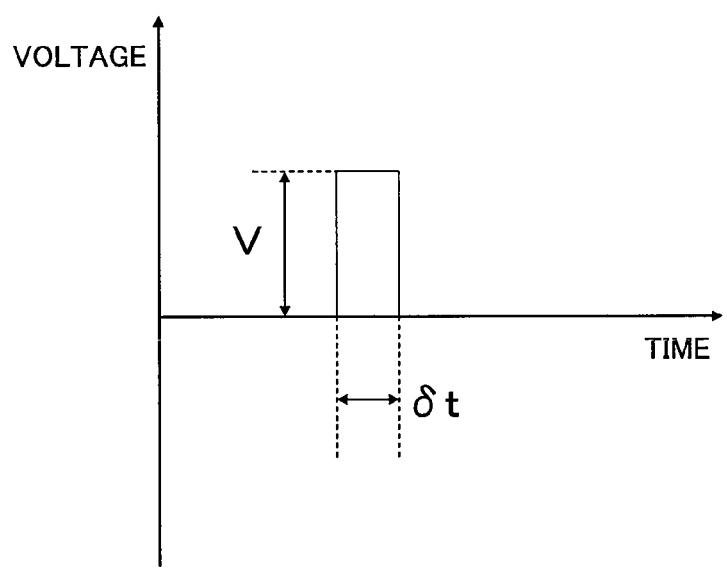
FIG. 2 is a view showing an electric pulse applied between a first electrode and a second electrode included in the nonvolatile memory element according to Embodiment 1 of the present invention.

FIG. 2 is a view showing an electric pulse applied between the first and second electrodes included in the nonvolatile memory element according to Embodiment 1 of the present invention. FIG. 2 shows the electric pulse having a voltage V and a pulse width δt. The voltage is defined as the potential of the first electrode 111 based on the second electrode 113 as a reference.

Figure 3:
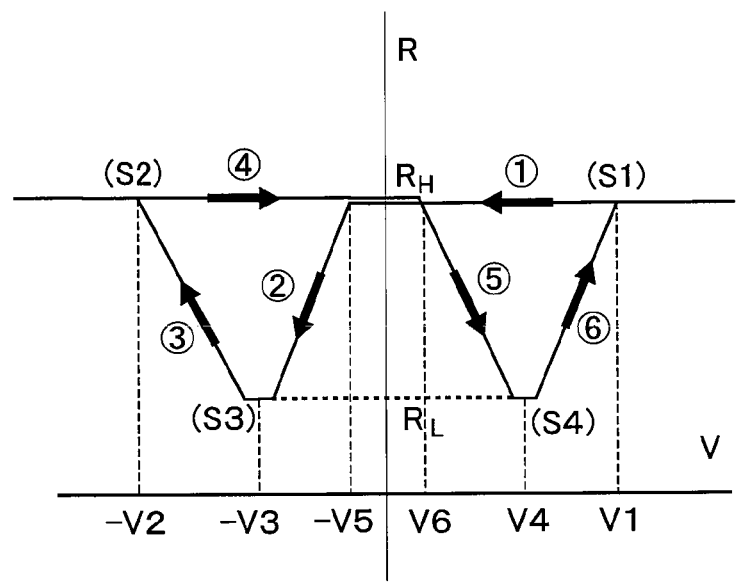
FIG. 3 is a view schematically showing a measurement result of a resistance value R of the memory element which is obtained by applying an electric pulse having a voltage of V and a pulse width 100 ns as shown in FIG. 2 between the first and second electrodes included in the nonvolatile memory element according to Embodiment 1 of the present invention and then by applying a voltage Vread between the first and second electrodes.

FIG. 3 is a view schematically showing a measurement result of a resistance value R of the memory element which is obtained by applying the electric pulse having the voltage V and the pulse width 100 ns as shown in FIG. 2 between the first and second electrodes included in the nonvolatile memory element according to Embodiment 1 of the present invention and then by applying a voltage Vread between the first and second electrodes.

Among the voltages V1 to V6 of the electric pulses applied between the electrodes of present embodiment, the voltage V1, the voltage V4, and the voltage V6 are positive voltages, and satisfy a relationship V1>V4>V6. The voltages V2, V3 and V5 are negative voltages and satisfy a relationship V5>V3>V2. In FIG. 3 and the explanation hereinafter, to clearly indicate that the voltage V2, the voltage V3 and the voltage V5 are negative voltages, they are expressed as −V2, −V3 and −V5, respectively.

The state of the element having the high-resistance value or the low-resistance value as an initial state changes to the high-resistance state (S1) in which the resistance value is $R_H$, when the electric pulse of the voltage V1 (>0) is applied between the electrodes. When an electric pulse of a positive voltage is applied between the electrodes in the state (S1), the resistance value remains R$_H$ and does not change. On the other hand, when an electric pulse of a negative voltage V is applied between the electrodes in the state (S1), the resistance value remains R$_H$ and does not change if the absolute value of the voltage is V5 or less, but changes to a value lower than R$_H$ if the absolute value of the voltage is larger than V5. Then, when the electric pulse of the voltage −V3 is applied between the electrodes, the resistance value changes to a low-resistance state (S3) in which the resistance value has a minimum value R$_L$.

Further, when an electric pulse of a negative voltage V whose absolute value is larger than V3 is applied between the electrodes, the resistance value increases again. When the electric pulse of the voltage −V2 is applied between the electrodes, the resistance value turns to a high-resistance state (S2) in which the resistance value is approximately R$_H$. When an electric pulse of a negative voltage is applied between the electrodes in this state (S2), the resistance value remains R$_H$ and does not change. On the other hand, when an electric pulse of a positive voltage V is applied between the electrodes in the state (S2), the resistance value remains R$_H$ and does not change if the absolute value of the voltage is V6 or smaller, but changes to a value lower than R$_H$ if the absolute value of the voltage is larger than V6. Then, when the electric pulse of the voltage V4 is applied between the electrodes, the resistance value changes to the low-resistance state (S4) in which the resistance value is a minimum value R$_L$.

Further, when an electric pulse of a positive voltage V whose absolute value is larger than V4 is applied between the electrodes, the resistance value increases again, while when the electric pulse of the voltage V1 is applied between the electrodes, the state of the element turns to a high-resistance state (S1) in which the resistance value is approximately R$_H$.

Figure 4:
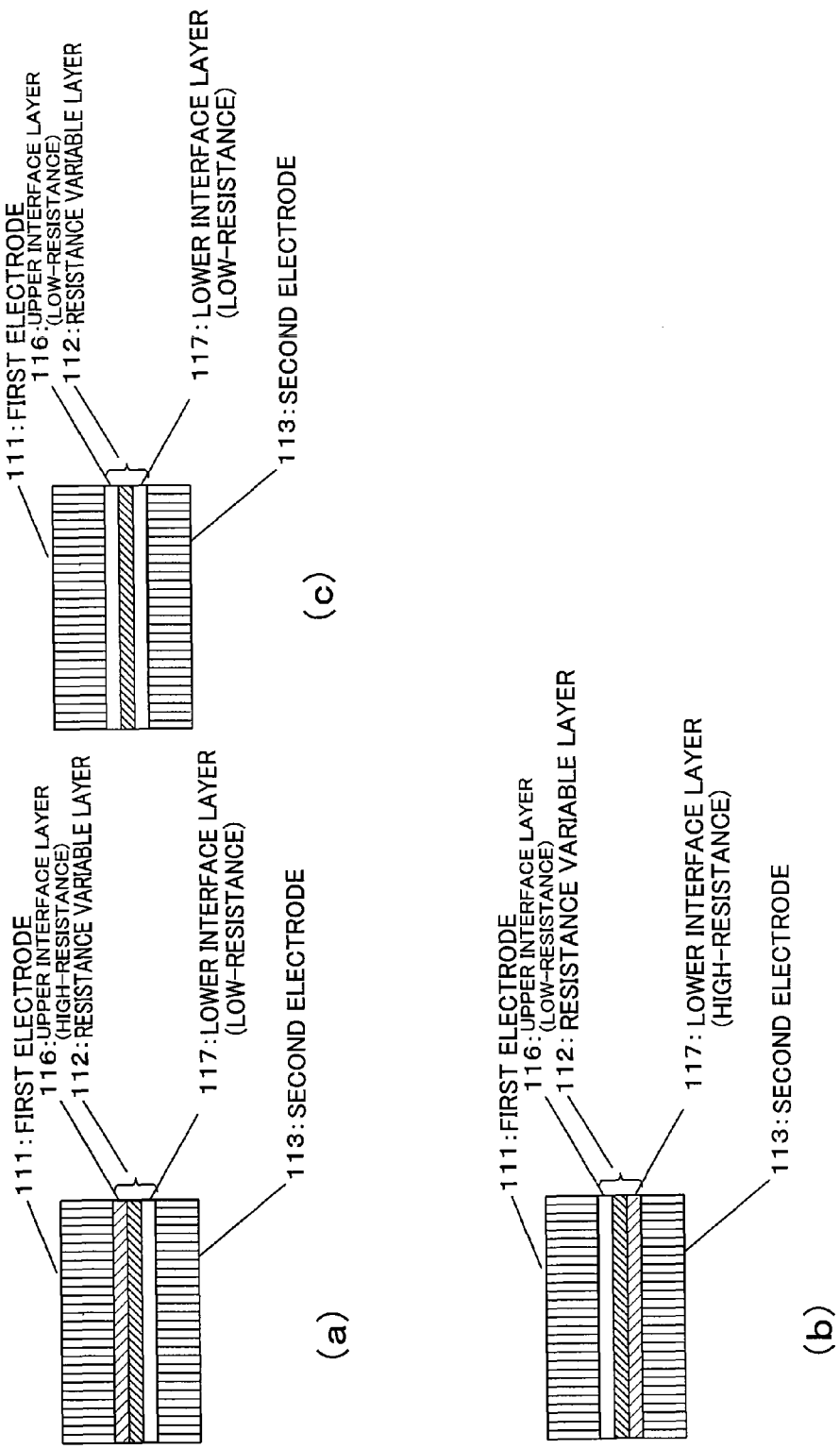

FIG. 4 is a cross-sectional view schematically showing a structure of the regions in the vicinity of interfaces between the resistance variable layer and the electrodes which are included in the nonvolatile memory element according to Embodiment 1 of the present invention, wherein FIG. 4(*a*) is a view showing a structure in the high-resistance state (S1) of FIG. 3, FIG. 4(*b*) is a view showing a structure in the high-resistance state (S2) of FIG. 3, and FIG. 4(*c*) is a view showing a structure in the low-resistance state (S3) and the low-resistance state (S4) of FIG. 3.

As shown in FIG. 4(*a*), in the high-resistance state (S1), the region (upper interface layer) in the vicinity of the interface between the resistance variable layer 112 and the first electrode 111 is in the high-resistance state and the region (lower interface layer) in the vicinity of the interface between the resistance variable layer 112 and the second electrode 113 is in the low-resistance state. On the other hand, as shown in FIG. 4(*b*), in the high-resistance state (S2), the upper interface layer and lower interface layer of the resistance variable layer 112 are in the low-resistance state and in the high-resistance state, respectively. Also, as shown in FIG. 4(*c*), in the low-resistance state (S3) and in the low-resistance state (S4), the upper interface layer and lower interface layer of the resistance variable layer 112 are both in the low-resistance state.

Whereas in the high-resistance state (S1) and in the high-resistance state (S2), the resistance values are R$_H$, their internal states are different as shown in FIGS. 4(*a*) and 4(*b*), and therefore, (S1) and (S2) are distinguishable from each other. On the other hand, in the low-resistance state (S3) and in the low-resistance state (S4), their internal states are the same as shown in FIG. 4(*c*), and therefore there is no way to distinguish them from each other. So, it is impossible to recognize (S3) and (S4) as different states from each other at present moment.

Present Example and Comparative Example

An element having the same structure as that of the nonvolatile memory element according to Embodiment 1 of the present invention shown in FIG. 1 was created as the present example, and characteristics of the present example were researched. In the present example, as the resistance variable layer 112, TaO$_x$ (x=1.5) is used.

Figure 5A:
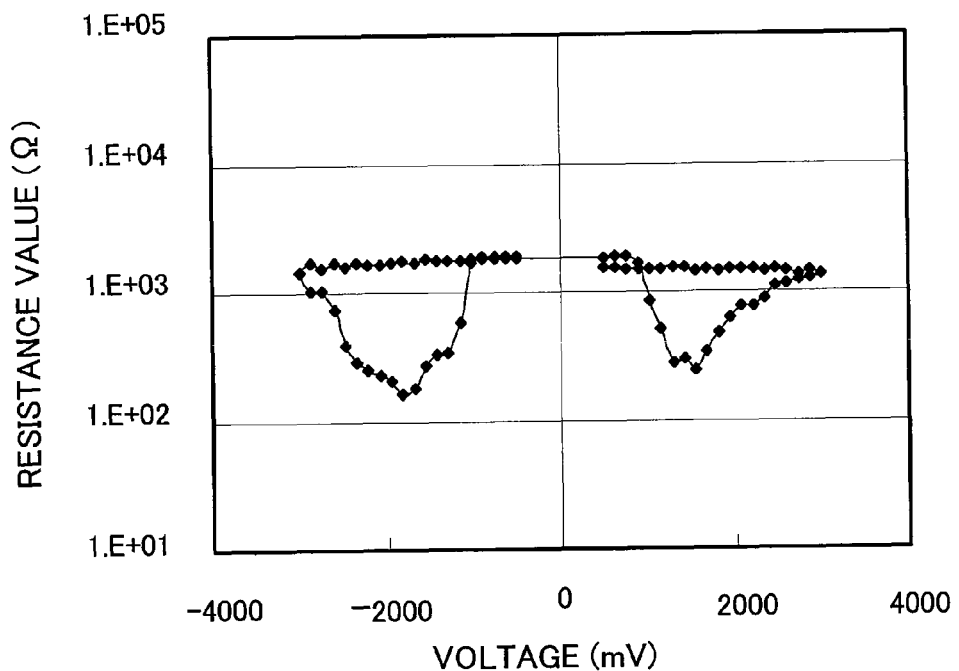
FIG. 5A is a view showing characteristics of a nonvolatile memory element according to the present example.

FIG. 5A is a view showing the characteristics of the nonvolatile memory element according to the present example. In FIG. 5A, a vertical axis indicates the resistance value of the element and a horizontal axis indicates the voltage applied between the electrodes.

With reference to FIG. 5A, it can be confirmed that present example has characteristics identical to those of the nonvolatile memory element of present embodiment described with reference to FIG. 3. That is, it can be confirmed that present example can have the high-resistance state (S1), the high-resistance state (S2), the low-resistance state (S3) or the low-resistance state (S4) according to the voltage applied between the electrodes. From this, it may be said that present example functions as the nonvolatile memory element capable of stably reading and writing of multi-valued data. In present example, the values of the voltages shown in FIG. 3 are approximately such that V1=3V, −V2=−3V, −V3=−2V, V4=1.6V, −V5=−0.5V, and V6=0.5V.

Subsequently, as a comparative example, a nonvolatile memory element including a resistance variable layer made of Fe oxide was created and its characteristics were researched. The structure of the comparative example is identical to that of the above present example except for the resistance variable layer.

Figure 5B:
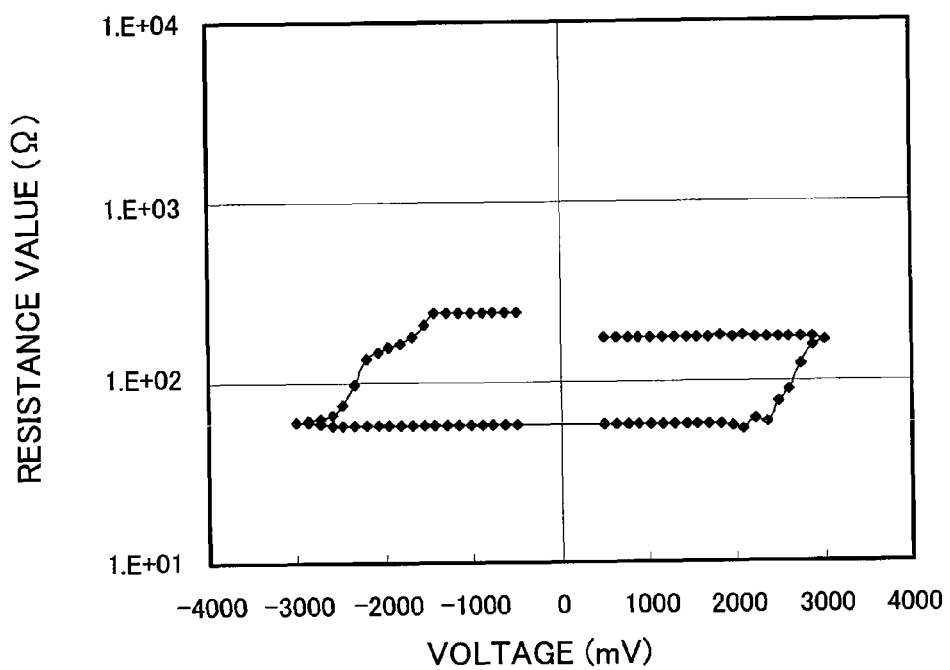
FIG. 5B is a view showing characteristics of a nonvolatile memory element according to a comparative example.

FIG. 5B is a view showing the characteristics of the nonvolatile memory element according to the comparative example. As can be clearly seen from FIG. 5B, in the comparative example, the high-resistance state (S1), the high-resistance state (S2), the low-resistance state (S3) and the low-resistance state (S4) cannot be confirmed unlike the nonvolatile memory element of present embodiment. From this, it may be difficult to stably read and write multi-valued data using the comparative example.

Whereas in present embodiment, the tantalum oxide is used as the resistance variable layer, other metal oxides may have the high-resistance states and low-resistance states as in present embodiment. For example, the metal oxides are Ti (titanium), V (vanadium), Zr (zircon), Nb (niobium), Hf (hafnium), and W (tungsten). V and Nb are elements belonging to the same group (V group) as Ta. It is known that Ti, Zr, Hf (IV group) and W (VI group) belonging to groups before and after V group are relatively similar in quality to Ta, and these elements can achieve the advantage as in Ta.

[Writing Method and Reading Method]

By causing "0" and "1" to correspond to the high-resistance state and the low-resistance state, respectively, using the element having the characteristics shown in FIG. 3, the element is operable as the nonvolatile memory for storing 1-bit data. For example, it is possible that "0" and "1" are caused to correspond to (S1) and (S3), respectively. In this case, the state of the element is changed to the high-resistance state (S1) by applying the voltage V1 between the electrodes, and the state of the element is changed to the low-resistance state (S3) by applying an electric pulse of a voltage −3V between the electrodes in the state (S1). By applying an electric pulse of a voltage Vread whose absolute value is smaller than V5 and V6 between the electrodes, reading the resistance value of the element, and determining whether the resistance value is either $R_H$ or $R_L$, the state (S1) and the state (S3) are distinguishable without changing the resistance value.

As another method of storing 1-bit data, the high-resistance state (S2) and the low-resistance state (S4) may be used. In this case, the state of the element is changed to the high-resistance state (S2) by applying a voltage −V2 between the electrodes, and the state of the element is changed to the low-resistance state (S4) by applying an electric pulse of the voltage V4 between the electrodes in the state (S2). By applying an electric pulse of a voltage Vread whose absolute value is smaller than V5 and V6 between the electrodes, reading the resistance value of the element, and determining whether the resistance value is either $R_H$ or $R_L$, the state (S2) and the state (S4) are distinguishable without changing the resistance value.

Alternatively, three-valued data can be stored using the state (S1) to the state (S3) of the element. In this case, the state of the element is changed to the state (S1) in which the resistance value is $R_H$ by applying the electric pulse of the voltage V1 between the electrodes. Also, the state of the element is changed to the state (S2) in which the resistance value is $R_H$ by applying the electric pulse of the voltage −V2 between the electrodes. Further, the state of the element is changed to the state (S1) by applying the electric pulse of the voltage V1 between the electrodes, and then is changed to the state (S3) by applying the electric pulse of the voltage −V3 between the electrodes. By allocating the state (S1) to the state (S3) obtained as described above to the three-valued data, respectively, the three-valued data can be written.

In the case where the three-valued data are written in the manner as described above, it is necessary to distinguish the three different states to read out these data. The distinguishing method is as follows. First, in a first step, an electric pulse of a voltage Vread whose absolute value is smaller than V5 and V6 is applied between the electrodes, the resistance value of the element is read, and the resistance value is determined as $R_H$ or $R_L$, so that the state of the element is determined as one of the states (S1) to (S3). To be specific, if the resistance value of the element is $R_H$, the state of the element is found to be (S1) or (S2), while if the resistance value of the element is $R_L$, the state of the element is found to be (S3). Therefore, if the resistance value is $R_L$, it is decided that the state is (S3). On the other hand, if the resistance value is $R_H$, there arises a need for a second step for determining whether the state of the element is the state (S1) or the state (S2).

In the second step, first, the electric pulse of the voltage V4 is applied between the electrodes. If the state is (S1), it remains (S1) and does not change. On the other hand, if the state is (S2), the state is changed to (S4) in response to the electric pulse of the voltage V4. Therefore, by applying the electric pulse of the voltage Vread whose absolute value is smaller than V5 and V6, reading the resistance value of the element, and determining whether the resistance value is $R_H$ or $R_L$, it can be determined that the state before applying the electric pulse of the voltage V4 is the state (S1) or the state (S2). If the resistance value is $R_H$, it is decided that the state is (S1), while if the resistance value is $R_L$, it is decided that the state is (S2). In the manner as described above, it is possible to distinguish between two states, i.e., the state (S1) and the state (S2) in which the resistance value is $R_H$. If the state of the element is determined as the state (S2), the electric pulse of the voltage −V2 is further applied between the electrodes to return the state of the element to the state (S2), because the state of the element has been changed to (S4) in response to the electric pulse of the voltage V4 applied initially in the second step.

The above described reading method corresponds to so-called breakdown reading, since the state of the element changes in response to the electric pulse applied between the electrodes in the second step.

Using the three states of (S1) to (S3) in the manner described above, the nonvolatile memory element of present embodiment is operable as the memory element for three-values which are more than 1 bit.

Another method may be used to read and distinguish the three states as described below. Initially, in a first step, an electric pulse of a voltage Vread1 whose absolute value is smaller than V5 and V6 is applied between the electrodes, the resistance value of the element is read, and the resistance value is determined as $R_H$ or $R_L$, so that the state of the element is determined as one of the states (S1) to (S3). To be specific, if the resistance value of the element is $R_H$, the state of the element is found to be (S1) or (S2), while if the resistance value of the element is $R_L$, the state of the element is found to be (S3). Therefore, if the resistance value is $R_L$, it is decided that the state is (S3). On the other hand, if the resistance value is $R_H$, there arises a need for a second step for determining whether the state of the element is the state (S1) or the state (S2).

In the second step, an electric pulse of a voltage Vread2 whose absolute value is smaller than V5 and V6 is applied between the electrodes, an electric pulse of a voltage −Vread2 which is different in polarity from Vread2 and is equal in absolute value to Vread2 is applied between the electrodes, the resistance values are measured, and the values are expressed as R2 and R3, respectively.

Figure 6:
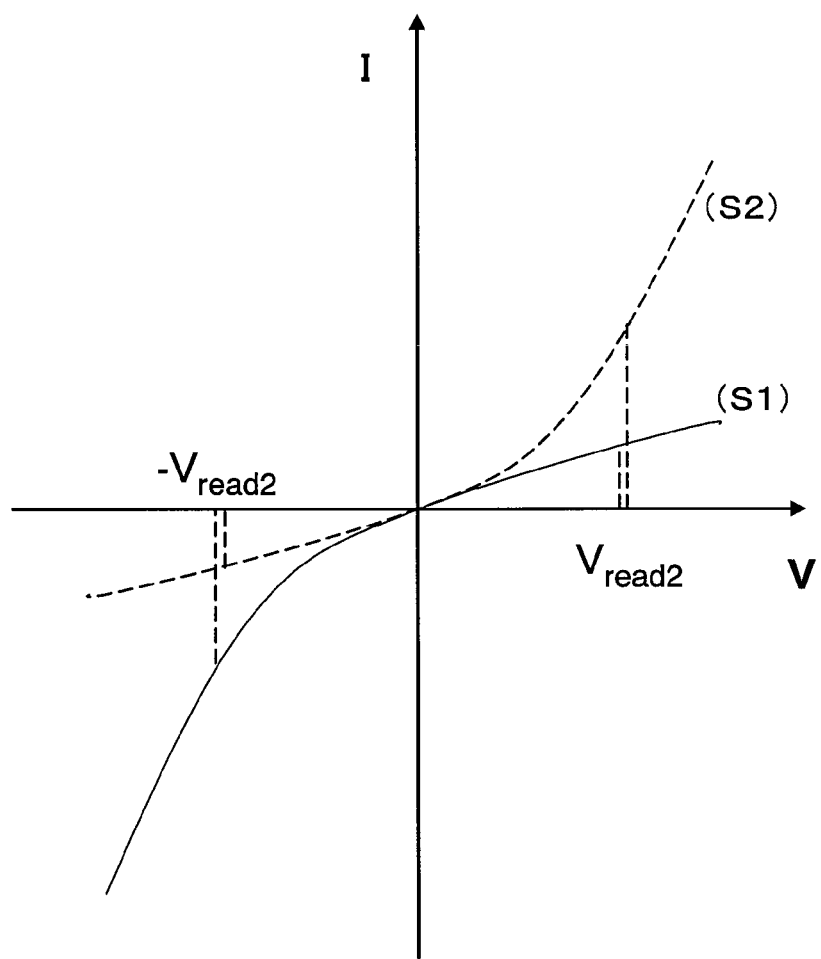
FIG. 6 is a view showing a value of a current flowing in the element as a function of a voltage applied between the both electrodes in the state (S1) and the state (S2).

FIG. 6 is a view showing a value of the current flowing in the element as a function of the voltage applied between the electrodes in the state (S1) and in the state (S2). As can be seen from FIG. 5, the obtained resistance values are R2>R3 in the case of the state (S1), and are R2<R3 in the case of the state (S2). Therefore, by comparing the value of R2 to the value of R3, it is possible to determine whether the state of the element is the state (S1) or the state (S2). According to this method, since the absolute value Vread2 of the voltage of the electric pulse applied in the second step is smaller than V5 and V6, it is possible to determine whether the state of the element is the state (S1) or the state (S2) without changing the state, i.e., non-breakdown.

It is possible to store three-valued data using the state (S1), the state (S2), and the state (S4) instead of using the state (S1) to the state (S3) as described above. The operation in this case is similar to that in the case of storing the three-valued data using the state (S1) to (S3), and will not be described.

When the nonvolatile memory element of present embodiment is operated as the memory element which reads and writes data which is more than 1 bit, the resistance value in each state is $R_H$ or $R_L$, the difference between the values is large enough to distinguish them, and retention characteristics of the respective states are good.

As described above, the nonvolatile memory element of present embodiment has the structure only in one stage in which the resistance variable layer intervenes between the electrodes. The structures may be stacked in multiple stages. The example is shown in FIG. 7.

Figure 7:
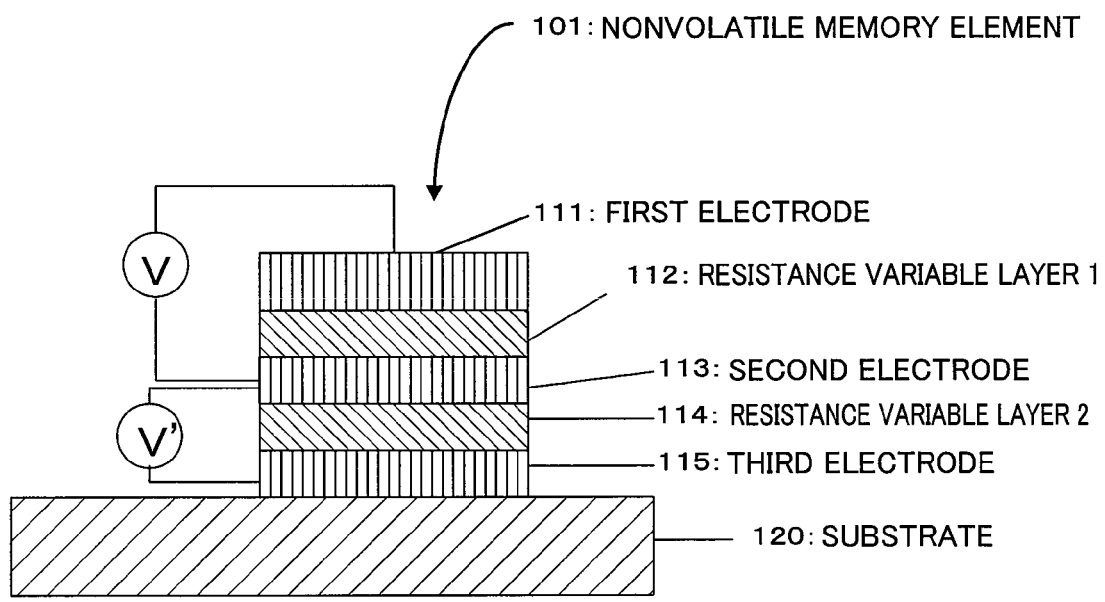
FIG. 7 is a cross-sectional view showing an example of another structure of the nonvolatile memory element according to present embodiment.

A nonvolatile memory element 101 shown in FIG. 7 has in two stages the structure in which the resistance variable layer intervenes between the electrodes. To be specific, the nonvolatile memory element 101 has a laminated-layer structure including the first electrode 111, the second electrode 113, and the resistance variable layer 112 intervening between the electrodes, and a laminated-layer structure including the second electrode 113, a third electrode 115, and a resistance variable layer 114 intervening between the electrodes. In this case, three-valued data is stored using the first electrode 111, the second electrode 113, and the resistance variable layer 112, and three-valued data is stored using the second electrode 113, the third electrode 115 and the resistance variable layer 114, so that data of (3×3)=9 values in total can be stored.

Embodiment 2

Subsequently, a nonvolatile memory element according to Embodiment 2 of the present invention will be described. In Embodiment 2, a third electrode, a fourth electrode and others are added to the structure including the first and second electrodes shown in Embodiment 1, allowing the memory element to have n (≧3) electrodes for each resistance variable layer. In such a structure, the memory element is operable as a multi-valued memory element for storing more data. Hereinafter, the case where four electrodes are provided will be described.

Figure 8:
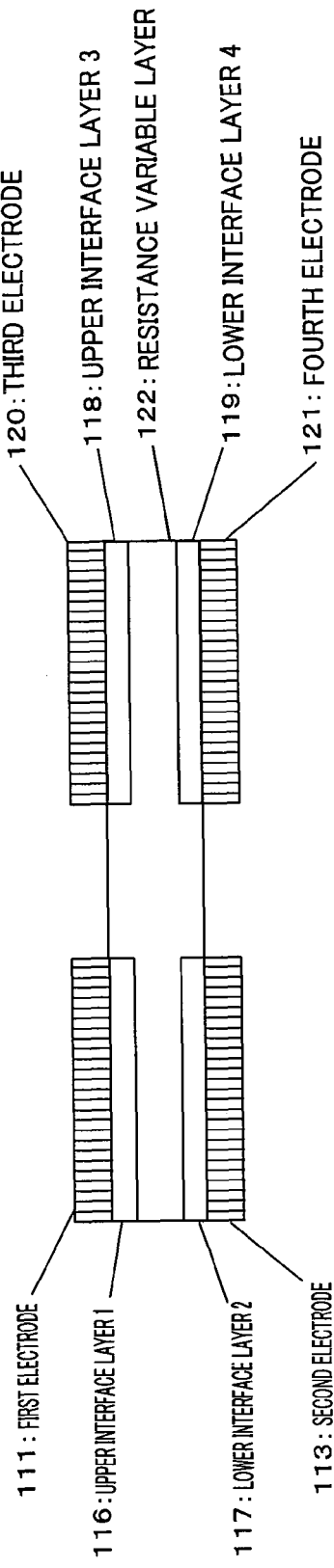
FIG. 8 is a cross-sectional view showing a structure of a nonvolatile memory element according to Embodiment 2 of the present invention.

FIG. 8 is a cross-sectional view showing a structure of a nonvolatile memory element according to Embodiment 2 of the present invention. As shown in FIG. 8, the nonvolatile memory element according to present embodiment has a structure in which two electrodes 111 and 120 are provided on an upper portion of the resistance variable layer 122 and two electrodes 113 and 114 are provided on a lower portion of the resistance variable layer 122. In FIG. 8, the substrate and the like are omitted.

Among the four electrodes of the element, a pair of electrodes are selected. Between each of six pairs of electrodes, i.e., between the first electrode 111 and the second electrode 113, between the first electrode 111 and the third electrode 120, between the first electrode 111 and the fourth electrode 121, between the second electrode 113 and the third electrode 120, between the second electrode 113 and the fourth electrode 121, and between the third electrode 120 and the fourth electrode 121, an electric pulse is applied so that the memory element becomes the high-resistance state (S1), the high-resistance state (S2), the low-resistance state (S3) or the low-resistance state (S4) as in the method of Embodiment 1. Thereby, the regions in the vicinity of the interfaces between the resistance variable layer 122 and the electrodes can be turned to the high-resistance state or to the low-resistance state. Using a combination of the states, multi-valued data can be stored.

Table 1 shows the states of the region (upper interface layer 116) in the vicinity of the interface between the resistance variable layer 122 and the first electrode 111, the region (lower interface layer 117) in the vicinity of the interface between the resistance variable layer 122 and the second electrode 113, the region (upper interface layer 118) in the vicinity of the interface between the resistance variable layer 122 and the third electrode 120, and the region (lower interface layer 119) in the vicinity of the interface between the resistance variable layer 122 and the fourth electrode 121. The interfaces 1 to 4 in Table 1 correspond to the upper interface layer 116, the lower interface layer 117, the upper interface layer 118, and the lower interface layer 119, respectively. In table 1, H indicates the high-resistance state and L indicates the low-resistance state.

TABLE 1

| | STATE OF INTERFACE | | | | | RESISTANCE BETWEEN ELECTRODES | | | | | |
|---|---|---|---|---|---|---|---|---|---|---|---|
| | INTERFACE1 | INTERFACE2 | INTERFACE3 | INTERFACE4 | | 1⇔2 | 1⇔3 | 1⇔4 | 2⇔3 | 2⇔4 | 3⇔4 |
| 1 | L | L | L | L | | L | L | L | L | L | L |
| 2 | H | L | L | L | | H | H | H | L | L | L |
| 3 | L | H | L | L | | H | L | L | H | H | L |
| 4 | L | L | H | L | | L | H | L | H | L | H |
| 5 | L | L | L | H | | L | L | H | L | H | H |
| 6 | H | H | L | L | | H | H | H | H | H | L |
| 7 | H | L | H | L | | H | H | H | H | L | H |
| 8 | H | L | L | H | | H | H | H | L | H | H |
| 9 | L | H | H | L | | H | L | L | H | H | H |
| 10 | L | H | L | H | | H | L | H | H | H | H |
| 11 | L | L | H | H | | L | H | H | H | H | H |
| 12 | H | H | H | L | | H | H | H | H | H | H |
| 13 | H | H | L | H | | H | H | H | H | H | H |
| 14 | H | L | H | H | | H | H | H | H | H | H |
| 15 | L | H | H | H | | H | H | H | H | H | H |

H: HIGH RESISTANCE
L: LOW RESISTANCE

When making combinations of the states, a combination in which all of the states of the regions in the vicinity of the interfaces are high-resistance states is not attained. Therefore, the number of combinations of the states is, as shown in Table 1, 15. That is, the combinations of 15 different states are attained.

An example of the reading method of the nonvolatile memory element of present embodiment is as follows. First, an electric pulse of a voltage Vread whose absolute value is smaller than V5 and V6 is applied between the electrodes, and the resistance value is read. Then, it is determined whether or not the resistance value is R$_L$. This makes it possible to distinguish the combinations of the states without changing the resistance values. As shown in Table 1, the combinations of twelve different states can be distinguished depending on whether or not the resistance value is R$_L$. By allocating the combinations of the states which are distinguishable to twelve-valued data, the nonvolatile memory element of present embodiment is operable as a multi-valued memory for storing twelve-valued data.

Embodiment 3

Figure 9:
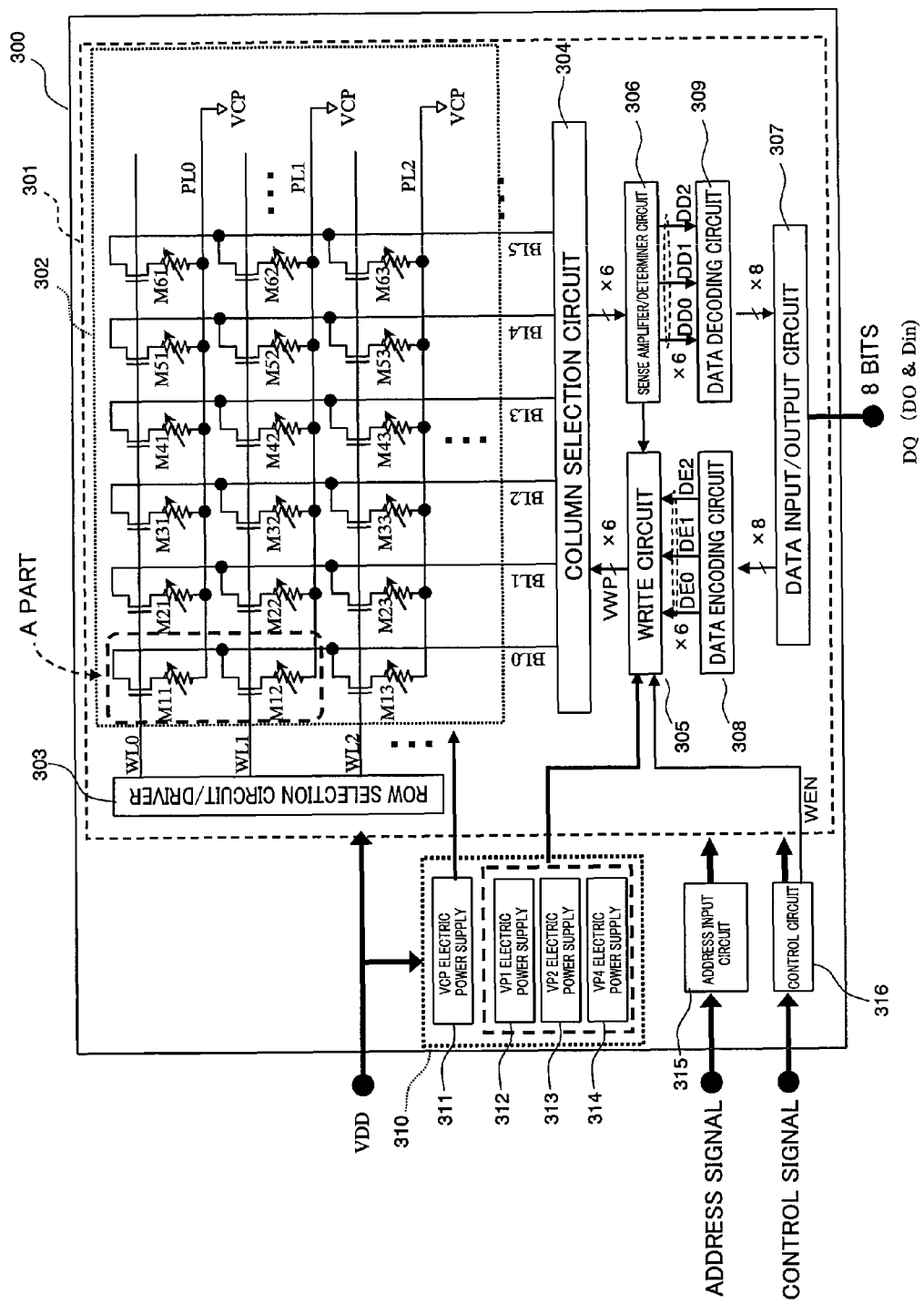
FIG. 9 is a block diagram showing a configuration of a nonvolatile semiconductor memory apparatus according to Embodiment 3 of the present invention.

FIG. 9 is a block diagram showing a configuration of a nonvolatile semiconductor memory apparatus according to Embodiment 3 of the present invention.

As shown in FIG. 9, a nonvolatile semiconductor memory apparatus 300 of the present embodiment includes on a semiconductor substrate, a memory main body 301. The memory main body 301 includes a memory array 302, a row selection circuit/driver 303, a column selection circuit 304, a write circuit 305 for writing data, a sense amplifier/determiner circuit 306 for detecting an amount of a current flowing in the selected bit line, determining the selected cell is in the high-resistance state or in the low-resistance state, determining multi-values or write command, as described later, a data input/output circuit 307 for inputting/outputting input/output data via a terminal DQ, a data encoding circuit 308 for converting 8-bit input data in binary expression to 6-bit data in three-valued expression, and a data decoding circuit 309 for converting 6-bit output data in three-valued expression to 8-bit data in binary expression.

The nonvolatile semiconductor memory apparatus 300 includes an electric power supply circuit 310 for generating plural kinds of voltages. The electric power supply circuit 310 includes a cell plate electric power supply (VCP electric power supply) 311, a VP1 write electric power supply 312 for supplying a voltage VP1, a VP2 write electric power supply 313 for supplying a voltage VP2, a VP4 write electric power supply 314 for supplying a voltage VP4. Furthermore, the nonvolatile semiconductor memory apparatus 300 includes an address input circuit 315 for receiving an address signal input externally and a control circuit 316 for controlling the operation of the memory main body 301 based on a control signal input externally.

The memory array 302 includes a plurality of word lines WL0, WL1, WL2, . . . and a plurality of bit lines BL0, BL1, BL2, . . . which are provided on the semiconductor substrate such that they are arranged to cross each other, and a plurality of memory cells M11, M12, M13, M21, M22, M23, M31, M32, M33 (hereinafter referred to as "memory cells M11, M12, . . . " which are provided to respectively correspond to cross points between the word lines WL0, WL1, WL2, . . . and the bit lines BL0, BL1, BL2, . . . The memory cells M11, M12, . . . each includes a nonvolatile memory element having a multi-valued resistance variable layer and a transistor. In present embodiment, as the nonvolatile memory element, a nonvolatile memory element having a structure in which the resistance variable layer including the tantalum oxide is sandwiched between the electrodes as described in Embodiment 1 is used.

The memory array 302 further includes a plurality of plate lines PL0, PL1, PL2, . . . which are arranged to extend in parallel with the word lines WL0, WL1, WL2, . . .

As shown in FIG. 9, the drains of the transistors constituting the memory cells M11, M12, M13, . . . are connected to the bit line BL0, and the drains of the transistors constituting the memory cells M21, M22, M23, . . . are connected to the bit line BL1.

The gates of the transistors constituting the memory cells M11, M21, M31, . . . are connected to the word line WL0, and the gates of the transistors constituting the memory cells M12, M22, M32, . . . are connected to the word line WL1.

The memory cells M11, M21, M31, . . . are connected to the plate line PL0, and the memory cells M12, M22, and M32 are connected to the plate line PL1.

The address input circuit 315 receives an address signal from an external circuit (not shown) and outputs, based on the address signal, a row address signal to the row selection circuit/driver 303 and a column address signal to the column selection circuit 304. The address signal is a signal indicating an address of a specified memory cell selected from among the plurality of memory cells M11, M12, . . . The row address signal is a signal indicating a row address of the address indicated by the address signal, while the column address signal is a signal indicating a column address of the address indicated by the address signal.

In a write cycle of data, a control circuit 316 outputs to the write circuit 305 a write signal for causing application of a write voltage according to input data Din which is input to the data input/output circuit 307. On the other hand, in a read cycle of data, the control circuit 310 outputs to the column selection circuit 304 a read signal for causing application of a read voltage.

The row selection circuit/driver 303 receives the row address signal output from the address input circuit 315, selects one from among the plurality of word lines WL0, WL1, WL2, . . . according to the row address signal, and applies a predetermined voltage to the selected word line.

The column selection circuit 304 receives the column address signal output from the address input circuit 315, selects six bit lines simultaneously for example, the plurality of bit lines BL0 to BL5, BL6 to BL11, . . . , according to the column address signal, and applies the write voltage or the read voltage to the selected bit lines.

The data encoding circuit 308 converts, as write data, 8-bit write data in binary expression which is input via the data input/output circuit 307 into 6-bit data in three-valued expression. The data encoding circuit 308 has sixth outputs of set of DE0, DE1, and DE2 and outputs DE0, DE1, and DE2 in parallel so as to indicate that one of DE0, DE1, and DE2 is in a high level in response to the input data. One example of the correspondence is shown in Table 2.

TABLE 2

| INPUT/OUTPUT (8 bit) | | | | | | | | MEMORY CELL (6 bit) | | | | | |
|---|---|---|---|---|---|---|---|---|---|---|---|---|---|
| D7 | D6 | D5 | D4 | D3 | D2 | D1 | D0 | M5 | M4 | M3 | M2 | M1 | M0 |
| 0 | 0 | 0 | 0 | 0 | 0 | 0 | 0 | 0 | 0 | 0 | 0 | 0 | 0 |
| 0 | 0 | 0 | 0 | 0 | 0 | 0 | 1 | 0 | 0 | 0 | 0 | 0 | 1 |
| 0 | 0 | 0 | 0 | 0 | 0 | 1 | 0 | 0 | 0 | 0 | 0 | 0 | 2 |
| 0 | 0 | 0 | 0 | 0 | 0 | 1 | 1 | 0 | 0 | 0 | 0 | 1 | 0 |
| 0 | 0 | 0 | 0 | 0 | 1 | 0 | 0 | 0 | 0 | 0 | 0 | 1 | 1 |
| 0 | 0 | 0 | 0 | 0 | 1 | 0 | 1 | 0 | 0 | 0 | 0 | 1 | 2 |
| ⇂INCREMENT (INTERMEDIATE PART IS OMITTED) | | | | | | | | ⇂INCREMENT (INTERMEDIATE PART IS OMITTED) | | | | | |
| 1 | 1 | 1 | 1 | 1 | 0 | 1 | 0 | 1 | 0 | 0 | 0 | 2 | 1 |
| 1 | 1 | 1 | 1 | 1 | 0 | 1 | 1 | 1 | 0 | 0 | 0 | 2 | 2 |
| 1 | 1 | 1 | 1 | 1 | 1 | 0 | 0 | 1 | 0 | 0 | 1 | 0 | 0 |
| 1 | 1 | 1 | 1 | 1 | 1 | 0 | 1 | 1 | 0 | 0 | 1 | 0 | 1 |

TABLE 2-continued

| INPUT/OUTPUT (8 bit) | | | | | | | | MEMORY CELL (6 bit) | | | | | |
|---|---|---|---|---|---|---|---|---|---|---|---|---|---|
| D7 | D6 | D5 | D4 | D3 | D2 | D1 | D0 | M5 | M4 | M3 | M2 | M1 | M0 |
| 1 | 1 | 1 | 1 | 1 | 1 | 1 | 0 | 1 | 0 | 0 | 1 | 0 | 2 |
| 1 | 1 | 1 | 1 | 1 | 1 | 1 | 1 | 1 | 0 | 0 | 1 | 1 | 0 |

$2^8$ = 256 COMBINATION
$3^6$ = 729 COMBINATION
0: HR2
1: LR
2: HR1

There are $2^8$=256 combinations for 8-bit data which is input in binary expression "0" or "1" to the inputs D0 to D7. To write these data without excess and deficiency to a memory cell which is capable of storing data in three-valued form "0," "1," or "2," 6-bit memory cells are needed. In this case, data of $3^6$=729 combinations can be stored. The correspondence of 256 combinations required for writing, among them, are shown in Table 2.

Table 3 shows an example of the correspondence between three-valued expression and the resistance states of the memory cells.

TABLE 3

| | DE0: HIGH LEVEL | DE1: HIGH LEVEL | DE2: HIGH LEVEL |
|---|---|---|---|
| RESISTANCE STATE OF MEMORY CELL | SECOND HIGH-RESISTANCE STATE RH2 | LOW-RESISTANCE STATE RL | FIRST HIGH-RESISTANCE STATE RH1 |

In present example, DE0 being in a high level is caused to correspond to $R_{H2}$, DE1 being in a high level is caused to correspond to $R_L$, and DE2 being in a high level is caused to $R_{H1}$. The data encoding circuit 308 sets one of DE0, DE1, and DE2 in a high level as a command for causing the write circuit 305 to write one of $R_{H1}$, $R_{H2}$, and $R_L$ to each of 6 bit memory cells adapted for 8 bits input.

Receiving the write command signal output from the write circuit 316, the write circuit 316 outputs the write voltage to the selected bit line via the column selection circuit 304.

Figure 10:
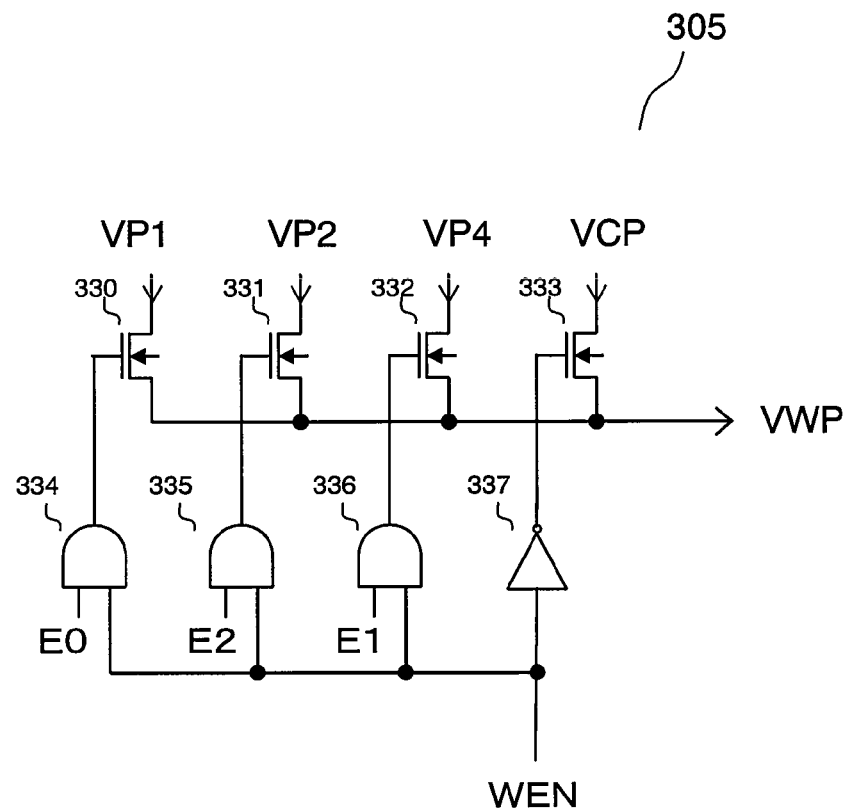
FIG. 10 is a circuit diagram of a write circuit.
Figure 11:
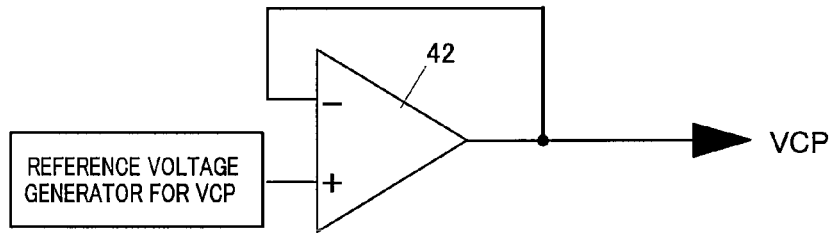
FIG. 11 is a circuit diagram of a VCP electric power supply, a VP1 electric power supply, a VP2 electric power supply, and a VP4 electric power supply.
Figure 11:
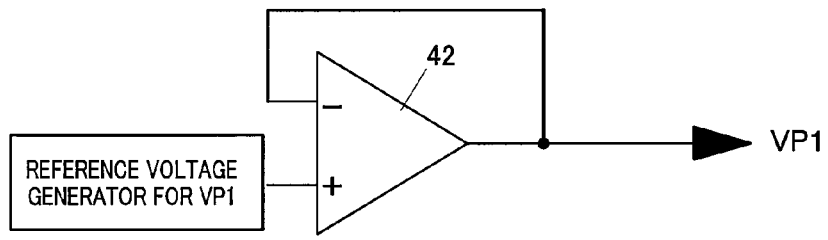
Figure 11:
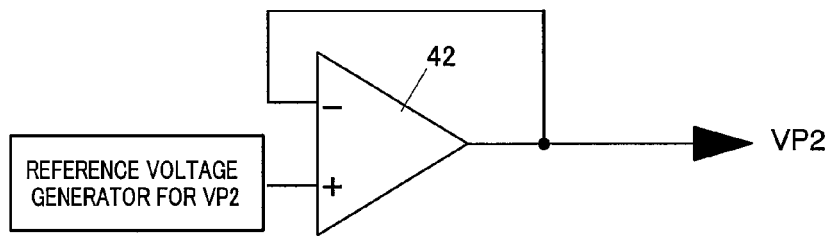
Figure 11:
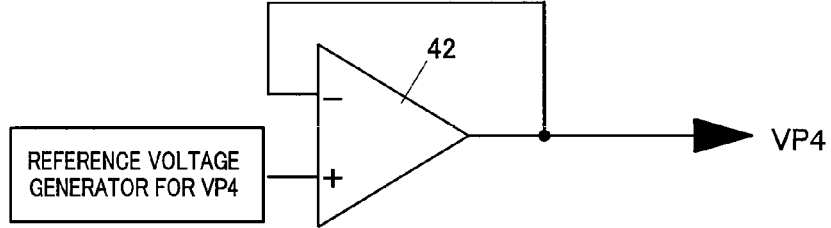

FIG. 10 is a circuit diagram of the write circuit 305. As shown in FIG. 10, the write circuit 305 includes NMOS transistors 330, 331, 332, and 333, AND gates 334, 335, and 336, and an inverter circuit 337. The output voltage VP1 of the VP1 electric power supply 312 is input to the drain of the NMOS transistor 330, and the output of the AND gate 334 is connected to the gate of the NMOS transistor 330. The output voltage VP2 of the VP2 electric power supply 313 is input to the drain of the NMOS transistor 331, and the output of the AND gate 335 is connected to the gate of the NMOS transistor 331. The output voltage VP4 of the VP4 electric power supply 314 is input to the drain of the NMOS transistor 332, and the output of the AND gate 336 is connected to the gate of the NMOS transistor 332. The output voltage VCP of the VCP electric power supply 311 is input to the drain of the NMOS transistor 333, and the output of the inverter 337 is connected to the gate of the NMOS transistor 333. The sources of the NMOS transistors 331, 332, 333, and 334 are input to a common VWP node and the outputs thereof are input to the column selection circuit 304.

The AND gate 334 has two inputs which are a write command signal WEN output from the control circuit 316 and a write command signal DE0 of $R_{H2}$ among the three values output from the data encoding circuit 308. The AND gate 335 has two inputs which are the write command signal WEN output from the control circuit 316 and a write command signal DE2 of $R_{H1}$ among the three values output from the data encoding circuit 308. The AND gate 336 has two inputs which are the write command signal WEN output from the control circuit 316 and a write command signal DE1 of $R_L$ among the three values output from the data encoding circuit 308. The write command signal WEN output from the control circuit 316 is input to the inverter 337.

The sense amplifier/determiner circuit 306 detects an amount of the current flowing in the selected bit line which is a read target and determines whether the memory cell which is a read target is in the high-resistance state or in the low-resistance state, in T1 cycle or T3 cycle as described later, among data read cycles. Based on the result of the read cycle T1 or T3, the sense amplifier/determiner circuit 306 determines that the resistance state of the memory cell which is the read target is $R_{H1}$, $R_{H2}$, or $R_L$, among the three values, and sets one of DD0, DD1, and DD2 in a high level as a command for the data decoding circuit 309 to indicate which of $R_{H1}$, $R_{H2}$, and $R_L$ the resistance state matches. In this case, one of DD0, DD1, and DD2 is set in a high level according to Table 4.

TABLE 4

| | DD0: HIGH LEVEL | DD1: HIGH LEVEL | DD2: HIGH LEVEL |
|---|---|---|---|
| RESISTANCE STATE OF MEMORY CELL | SECOND HIGH-RESISTANCE STATE RH2 | LOW-RESISTANCE STATE RL | FIRST HIGH-RESISTANCE STATE RH1 |

The data decoding circuit 309 converts, as write data, 6-bit read data in three-valued expression (one of DD0, DD1, and DD2 is in a high level) which is input from the sense amplifier/determiner circuit 306 into 8-bit data in binary expression. This conversion is performed according to the correspondence of Table 2 in the reverse relation to the processing in the data encoding circuit 308. The resulting output data DO is output to an external circuit as 8-bit data via the data input/output circuit 307.

The cell plate electric power supply (VCP electric power supply) 311, the VP1 electric power supply 312, the VP2 electric power supply 313, and the VP4 electric power supply 314, constituting the electric power circuit 310, are comprised of reference voltage generators and operational amplifier voltage drivers 42 which are generally known and shown in FIGS. 11(a) to 11(d).

Figure 12:
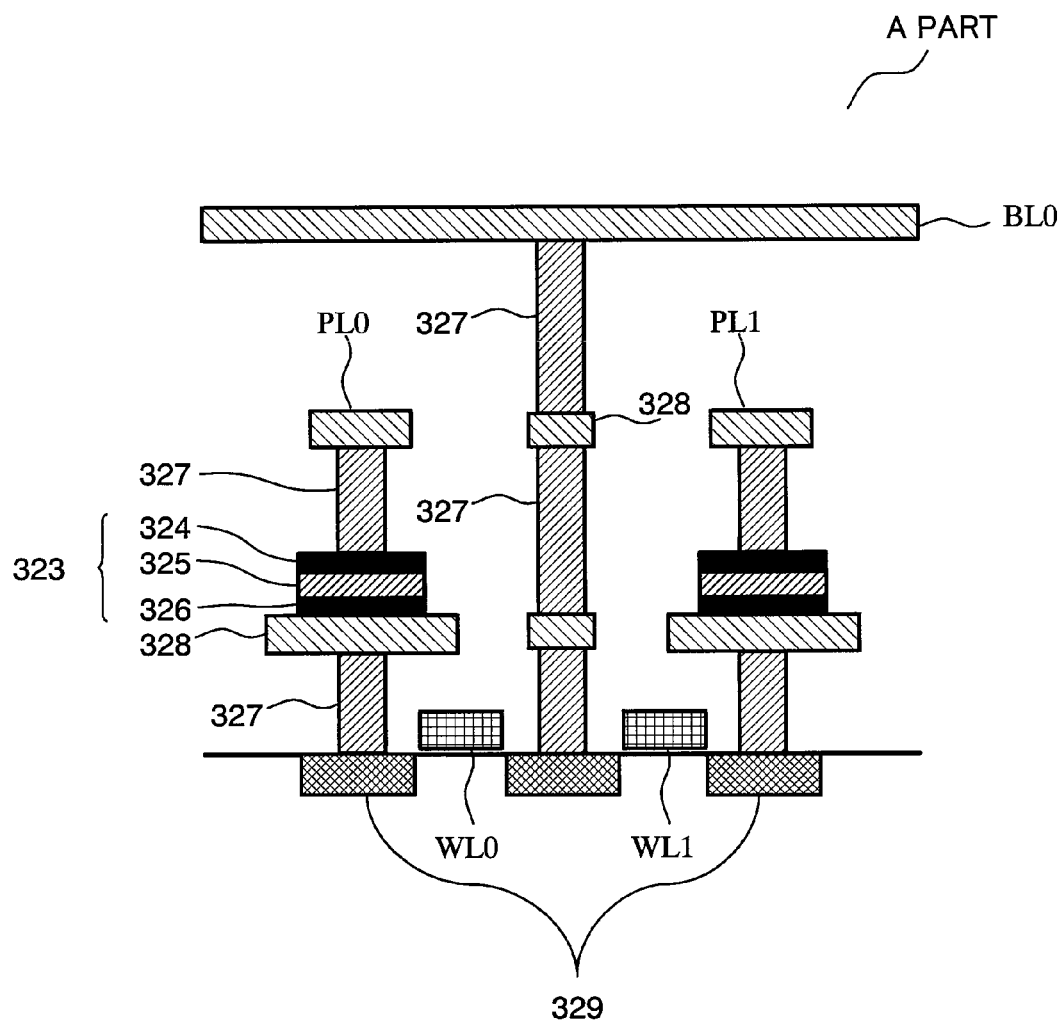
FIG. 12 is a cross-sectional view showing a structure of a A part of FIG. 9.

FIG. 12 is a cross-sectional view showing a structure of an A part (structure of 2 bits) in FIG. 9. A nonvolatile memory element 323 of FIG. 12 corresponds to the memory cells M11, M12, . . . of FIG. 9. The nonvolatile memory element 323 includes an upper electrode 324, a resistance variable layer 325 containing the tantalum oxide, and a lower electrode 326.

The bit line BL0 is disposed above the word lines WL0 and WL1, and the plate lines PL0 and PL1 are disposed between the word lines WL0 and WL1 and the bit line BL0. 327 denotes a plug layer, 328 denotes a metal wire layer, and 329 denotes a source/drain region.

[Example of Operation of Nonvolatile Semiconductor Memory Apparatus]

Subsequently, an example of the operation of the nonvolatile semiconductor memory apparatus according to Embodiment 3 in a write cycle for writing data and a read cycle for reading data will be described.

Figure 13:
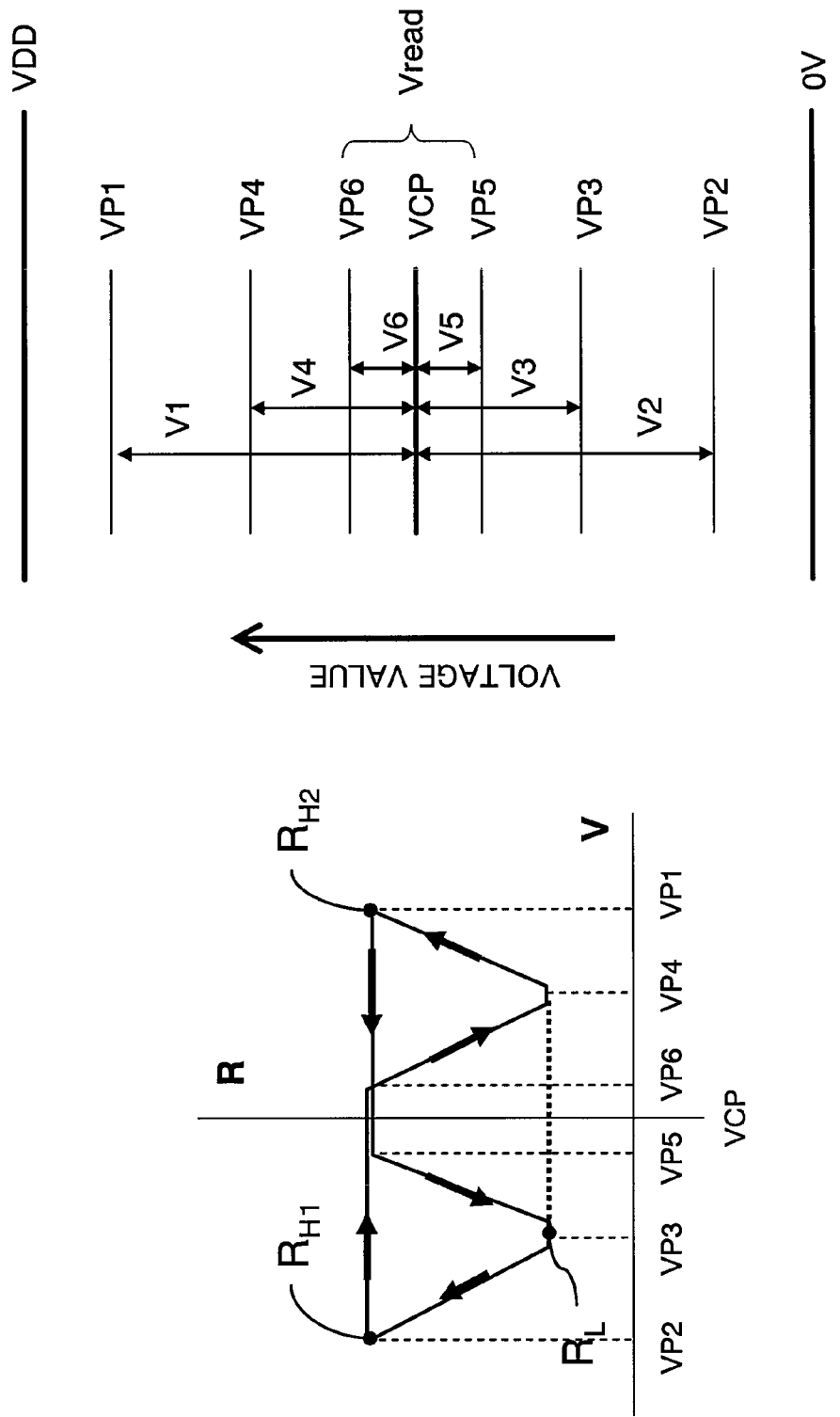
FIG. 13 is a view showing the relationship between three-valued resistance states ($R_{H1}$, $R_{H2}$, $R_L$) which are written to a resistance variable layer of a memory cell and voltage values required to set the resistance variable layer in the resistance states.

FIG. 13 is a view showing the correspondence between three-valued resistance states ($R_H1$, $R_H2$, $R_L$) which are written to the resistance variable layer 325 of the memory cell and voltage values required to set the resistance variable layer in the resistance states as in Embodiment 1. In the reference voltage generators included in the VCP electric power supply 311, the VP1 electric power supply 312, the VP2 electric power supply 313, and the VP4 electric power supply 314 shown in FIG. 11, the voltage values illustrated here are set in manufacturing steps of the nonvolatile semiconductor memory apparatus 300.

The upper electrode 324 of the memory cell is always supplied with a voltage VCP from the cell plate electric power supply lines PL0, PL1, .... The voltage of the lower electrode 326 is changed for a specified time based on the voltage VCP at the upper electrode 324 side as a reference, thereby performing a write operation and a read operation. After application of the voltage for the specified time, the VCP voltage is applied to the lower electrode 326 side, and a potential difference between the upper electrode 324 and the lower electrode 326 is maintained at 0V. The voltage between VP5 to VP6 which will not affect the resistance state is the read voltage Vread applied between the electrodes during the read operation.

First, the read cycle will be described.

Figure 14:
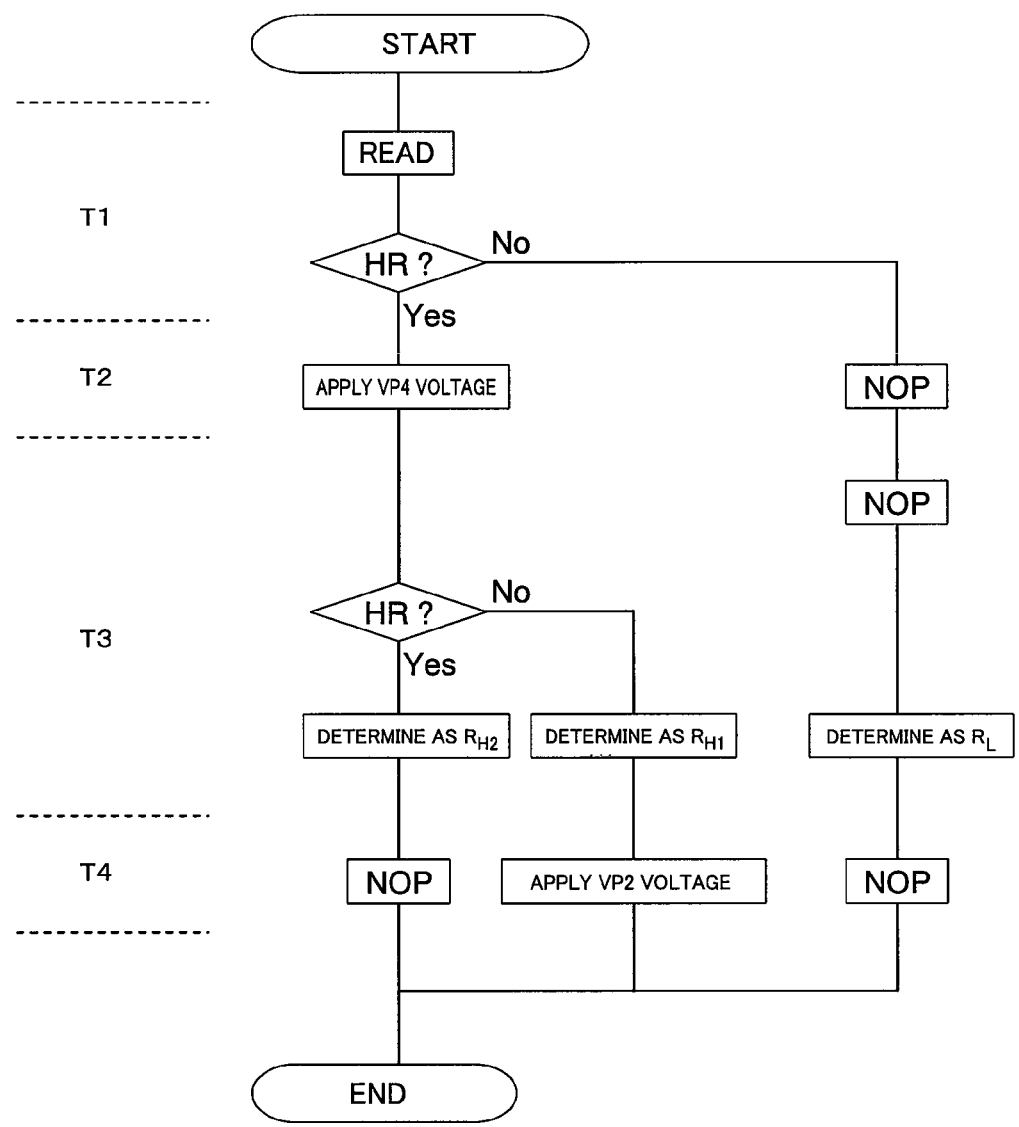
FIG. 14 is a flowchart of a read cycle in the nonvolatile semiconductor memory apparatus according to Embodiment 3 of the present invention.
Figure 15:
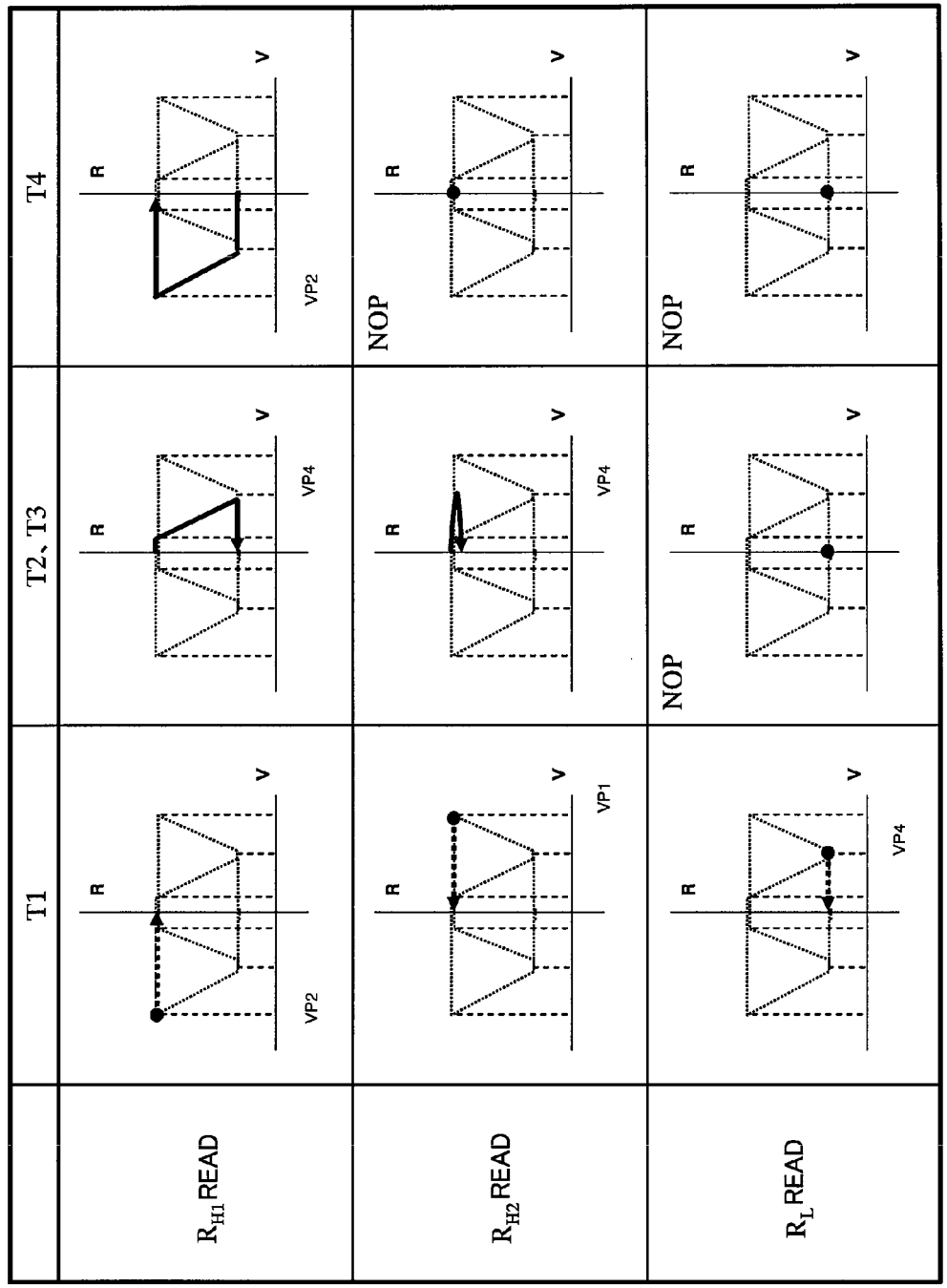
FIG. 15 is a state diagram showing a memory cell in each read step.

FIG. 14 is a flowchart of the read cycle. FIG. 15 is a diagram showing the state of the memory cell in each read step.

As shown in FIG. 14, the reading consist of a first step T1, a second step T2, a third step T3, and a fourth step T4. It is supposed that the resistance state written in the memory cell is one of three states $R_H1$, $R_H2$, and $R_L$. FIG. 14 shows transition of the resistance state in each step for each case.

[First Step T1]

The resistance value is read from the memory cell which is specified by the address signal input externally. The sense amplifier/determiner circuit 30 applies the Vread voltage to the selected memory cell, compares the value of the current flowing therein to a specified current value, and determines whether the memory cell is in the high-resistance state (HR) or in the low-resistance state based on the magnitude relationship between them. In this case, as shown in T1 of FIG. 15, when the resistance value of the selected memory cell is $R_H1$ or $R_H2$, in this step, it is determined that the state of the memory cell is the high-resistance state without distinguishment, while when the resistance value of the selected memory cell is $R_L$, it is determined that the state of the memory cell is the low-resistance state.

[Second Step T2]

When it is determined that the memory cell is in the high-resistance state in the first step S1, the voltage VP4 is applied for a specified time.

On the other hand, when it is determined that the memory cell is in the low-resistance state in the first step T1, in this step, NOP (no operation) state in which no processing occurs is maintained.

As indicated by T2 and T3 of FIG. 15, when the voltage V4 is applied when the resistance value of the read memory cell is $R_H1$, its resistance state transitions from the high-resistance value state to the low-resistance value state. On the other hand, when the voltage VP4 is applied when the resistance value of the read memory cell is $R_H2$, the resistance state does not change and keeps the high-resistance value state.

[Third Step T3]

The sense amplifier/determiner circuit 306 applies Vread voltage to the memory cell which has been applied with the voltage VP4 in the second step T2, compares a value of a current flowing therein to a specified current value, and determine whether the memory cell is in the high-resistance state or in the low-resistance state based on the magnitude relationship.

As indicated by T2 and T3 of FIG. 15, when the resistance value of the read memory cell is $R_H1$, it is determined that the state of the memory cell is the low-resistance value state, since the state has transitioned to the low-resistance value state in the second step T2, while when the resistance value of the read memory cell is $R_H2$, it is determined that the state of the memory cell is the high-resistance value state, since the high-resistance state is maintained in the second step T2. To the memory cell to which NOP processing has been performed in the second step T2, NOP processing is also performed in this step.

Through the steps performed so far, it is determined that the resistance value state written in the memory cell is one of the three values which are $R_H1$, $R_H2$, and $R_L$. According to the result, the sense amplifier/determiner circuit 306 sets one of the outputs DD0, DD1, and DD2 in a high level and transfer it to the data decoding circuit 309. The data decoding circuit 309 performs the data decoding processing according to Table 2 as described above and then the data input/output circuit 307 outputs 8-bit data to outside.

[Fourth Step T4]

Only to the memory cell which has been determined as $R_H1$ in the third step T3, the voltage VP2 is applied, and the read flow terminates. As indicated by T4 of FIG. 15, when the resistance value of the read memory cell is $R_H1$, it is returned to its initial resistance value state $R_H1$, by application of the voltage VP2 in this way, since the state of the read memory cell has transitioned to the low-resistance value state $R_L$ in the second step T2.

Subsequently, the write cycle will be described.

Figure 16:
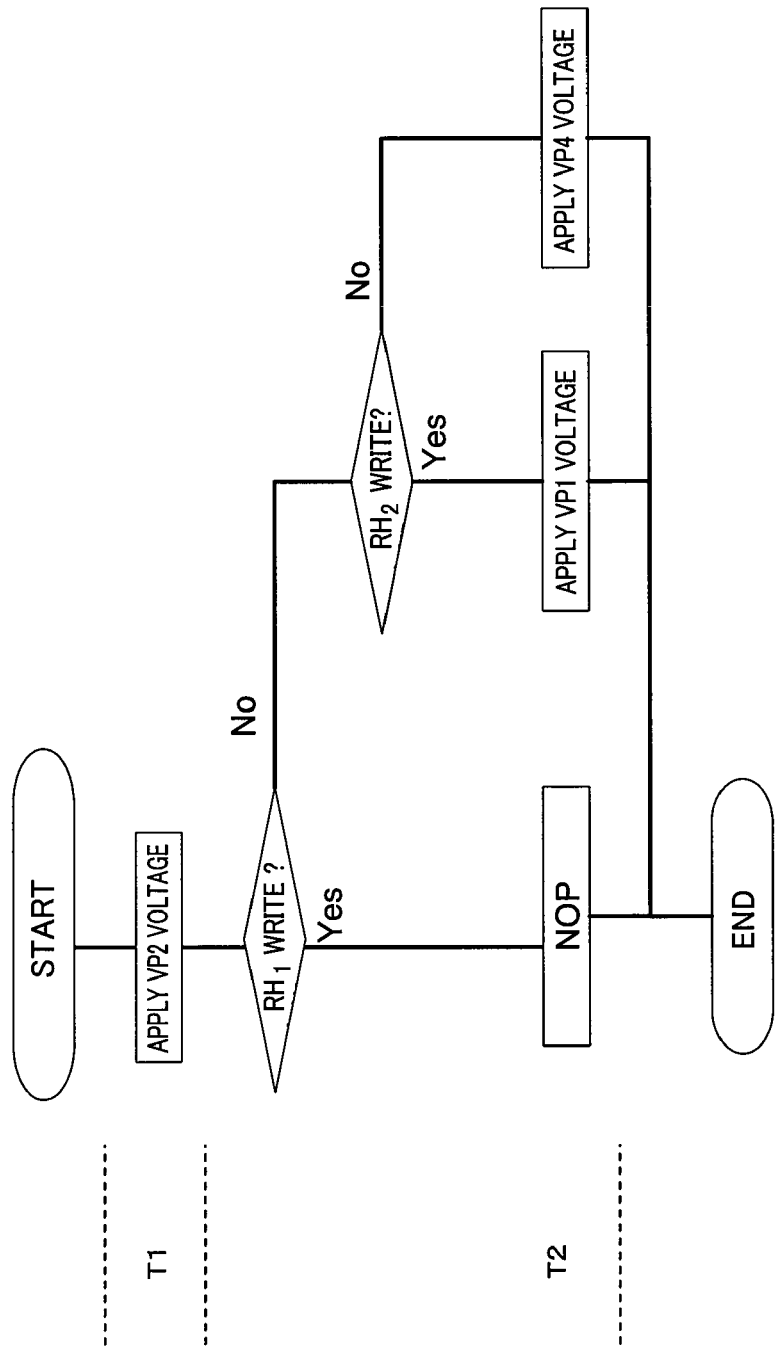
FIG. 16 is a flowchart of a write cycle in the nonvolatile semiconductor memory apparatus according to Embodiment 3 of the present invention.
Figure 17:
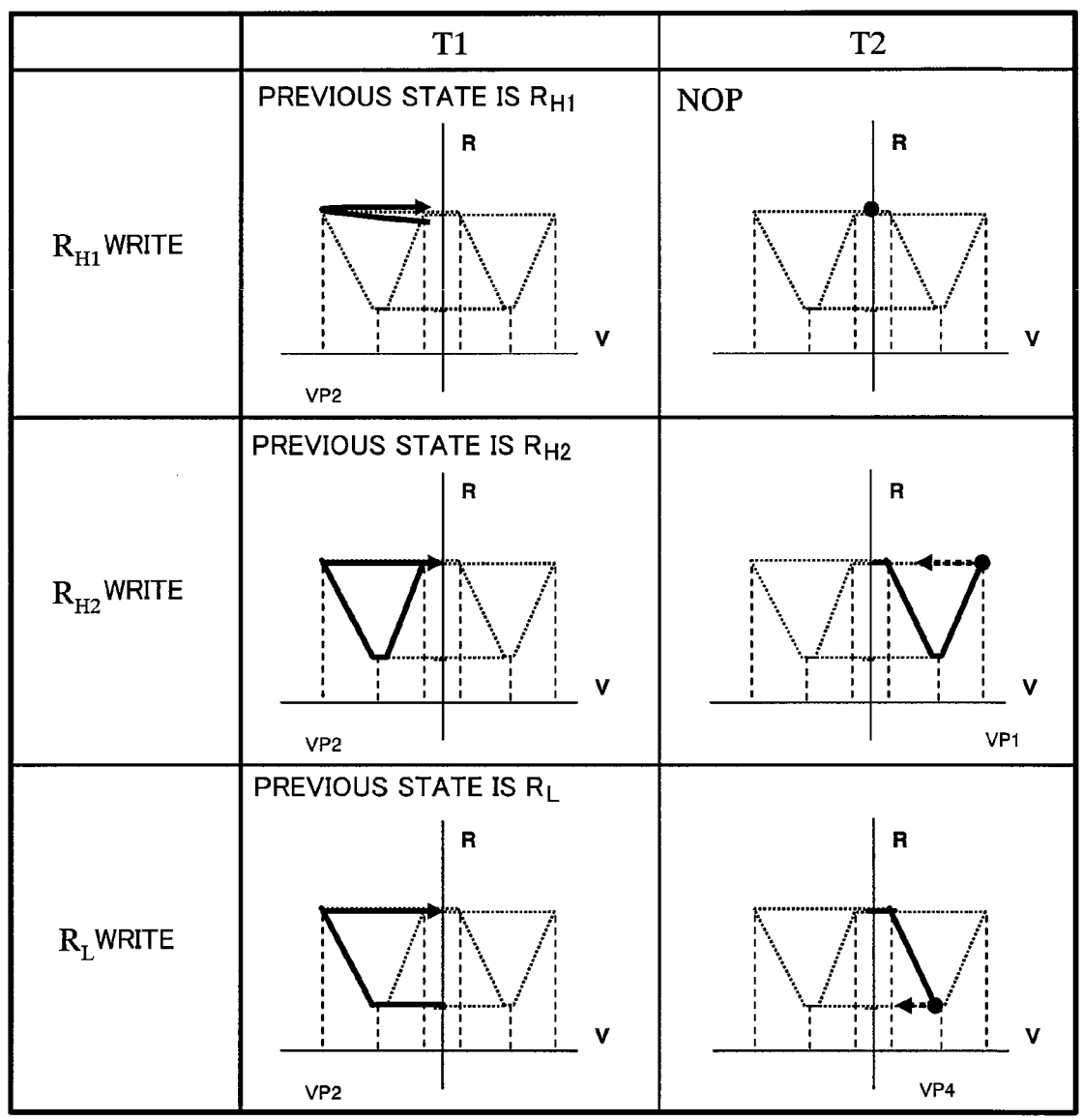
FIG. 17 is a state diagram showing a memory cell in each write step.
Figure 18:
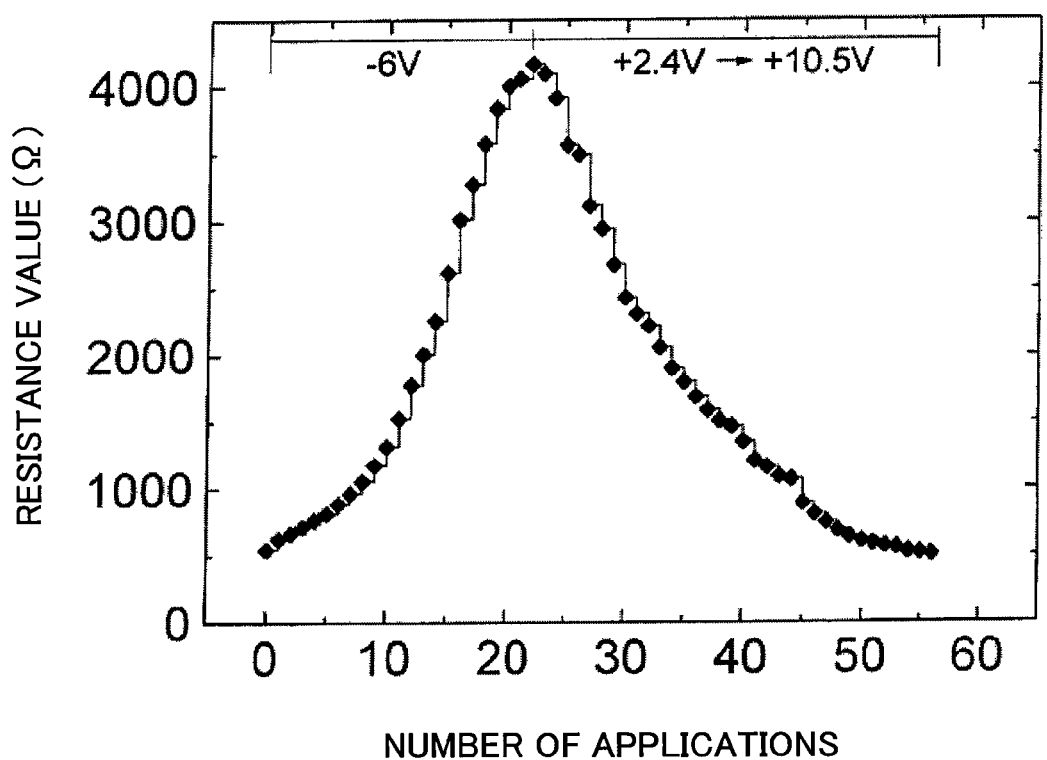
FIG. 18 is a view showing an example of a change in resistance in response to electric pulses used in the conventional memory apparatus.

FIG. 16 is a flowchart of the write cycle. FIG. 17 is a diagram showing the state of the memory cell in each write step.

As shown in FIG. 16, the writing consist of a first step T1 and a second step T2. It is supposed that the resistance state written in the memory cell is one of three states $R_H1$, $R_H2$, and $R_L$. FIG. 17 shows transition of the resistance state in each step for each case.

[First step T1]

This step corresponds to an erase operation for a write memory cell.

The voltage VP2 is applied to the memory cell which is specified according to an address signal input externally for a specified time. As indicated by T1 of FIG. 17, it is supposed that the resistance state of the memory cell is one of $R_H1$, $R_H2$, and $R_L$, which has been written in the memory cell before the present write cycle. If the previous state is $R_H1$ which is the first high-resistance state, the state of the resistance value is not affected by application of the voltage VP2 and keeps the state of $R_H1$. If the previous state is $R_H2$ which is the second high-resistance state, the resistance transitions to the state of $R_L$ once by application of the voltage of VP2, and then transition to $R_H1$ which is the first low-resistance state. If the previous state is $R_L$ which is the low-resistance state, the resistance state transitions to $R_H1$ which is the first resistance state by application of the voltage VP2.

In the manner described above, without depending on the previous state, the resistance states are set to $R_H1$ which is the same resistance state by application of the same voltage.

[Second Step T2]

Writing is performed according to the command signal DE0, DE1 or DE2 of the data encoding circuit 308. When DE2 is in a high level, this means a command for writing of the first high-resistance state $R_H1$. In this case, this resistance state is written in the first step T1, and NOP processing occurs. On the other hand, when DE0 is in a high level, this means a command for writing of the second high-resistance state $R_H2$, and therefore the voltage VP1 is applied for a specified period. When DE1 is in a high level, this means a command for writing of the low-resistance state $R_L$, and therefore the voltage VP4 is applied for a specified time.

As indicated by T2 of FIG. 17, in the case of $R_H2$ write, the resistance value transitions to $R_L$ once by application of the voltage VP1 and then transitions to the second high-resistance value state $R_L2$. In the case of $R_L$ write, the resistance value transitions to $R_L$ by application of the voltage VP4.

The nonvolatile semiconductor memory apparatus 300 according to Embodiment 3 is configured to perform the write operation and the read operation by causing 8-bit input/output data to correspond to 6 memory cells. Therefore, in present embodiment, data can be stored in the form of 3⁶=729 combinations, among which (729−256=473) combinations are unused states. Using the unused regions and using a known method, a capacity can be increased without substantially the chip size. Thus, a high-quality nonvolatile semiconductor memory apparatus is attained.

For example, the capacity may be increased to provide 9-bit (217 combinations are still unused regions among 512 combinations) input/output configuration while keeping the memory cells at an equal number. Or, the unused region may be allocated to 1 bit of a parity bit for error correction in external 8-bit input/output data configuration to provide an error correction ability while keeping the memory cells within the chip at an equal number. In this way, a higher-quality memory apparatus is easily attainable. Alternatively, the unused region may be used as back-up memory cells for redundant relief.

Whereas in present embodiment, as the internal electric power supply circuit, the VP1 electric power supply 312, the VP2 electric power supply 313, and the VP4 electric power supply 314 are respectively constituted, for example, an external electric power supply VDD may be used as the VP1 electric power supply, or a VSS (ground) electric power supply may be used as the VP2 electric power supply.

Having described a one transistor/one nonvolatile memory portion (1T1R) memory cell structure in present embodiment, a cross-point memory structure may be used as a matte of course. To be specific, the memory array may be configured to include a plurality of first electrode wires formed to extend in parallel with each other on the semiconductor substrate, a plurality of second electrode wires which are provided above the first electrode wires and arranged to extend in parallel with each other and to three-dimensionally cross the plurality of first electrode wires within a plane parallel to a main surface of the semiconductor substrate, and nonvolatile memory elements provided to respectively correspond to the three-dimensional cross points between the plurality of first electrode wires and the plurality of second electrode wires. As the nonvolatile memory elements, the nonvolatile memory elements according to Embodiment 1 may be used.

Moreover, it is needless to say that a verify operation may be added to check the state of the memory cell as desired in the read flow and the write flow shown in FIGS. 14 and 16.

Numerous modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element and nonvolatile memory array of the present invention are capable of stably storing data which is more than 1 bit, and are useful as a nonvolatile memory element and the like for use with electronic devices such as personal computers or cellular phones.

The invention claimed is:

1. A nonvolatile memory element comprising:
   a first electrode;
   a second electrode; and
   a resistance variable layer which intervenes between the first electrode and the second electrode, a resistance value of the resistance variable layer changing reversibly in response to electric pulses applied between the first electrode and the second electrode;
   wherein the resistance variable layer is configured to include at least an oxide of a metal element of IV group, V group or VI group;
   wherein when among voltages V1 to V6 of electric pulses applied between the first electrode and the second electrode, the voltage V1, the voltage V4 and the voltage V6 are positive voltages and have a relationship V1>V4>V6, and the voltage V2, the voltage V3, and the voltage V5 are negative voltages and have a relationship V5>V3>V2,
   (A) the resistance value of the resistance variable layer becomes a high-resistance value $R_H$ when the electric pulse of the voltage V1 is applied between the first electrode and the second electrode,
   thereafter the resistance value maintains the high-resistance value $R_H$ when an electric pulse of a positive voltage is applied between the first electrode and the second electrode, while the resistance value decreases when an electric pulse of a negative voltage which is smaller than the voltage V5 and larger than the voltage V3 is applied between the first electrode and the second electrode,
   the resistance value becomes a low-resistance value $R_L$ when the electric pulse of the voltage V3 is applied between the first electrode and the second electrode, then increases when an electric pulse of a negative voltage which is smaller than the voltage V3 and larger than the voltage V2 is applied between the first electrode and the second electrode or becomes the high-resistance value $R_H$ when the electric pulse of the voltage V2 is applied between the first electrode and the second electrode,
   (B) after the electric pulse of the voltage V2 is applied between the first electrode and the second electrode, the resistance value maintains the high-resistance value $R_H$ when an electric pulse of a negative voltage is applied between the first electrode and the second electrode, while the resistance value decreases when an electric pulse of a positive voltage which is larger than the voltage V6 and smaller than the voltage V4 is applied between the first electrode and the second electrode, the resistance value becomes the low-resistance value $R_L$ when the electric pulse of the voltage V4 is applied between the first electrode and the second electrode, and then increases when an electric pulse of a positive voltage which is larger than the voltage V4 and smaller than the voltage V1 is applied between the first electrode and the second electrode, or becomes the high-resistance value $R_H$ when the electric pulse of the voltage V1 is applied between the first electrode and the second electrode.

2. A writing method of the nonvolatile memory element according to claim 1, comprising the steps of:

applying the electric pulse of the voltage V1 between the first electrode and the second electrode to generate a first high-resistance state in which the resistance value of the resistance variable layer is the high-resistance value $R_H$;

applying the electric pulse of the voltage V2 between the first electrode and the second electrode to generate a second high-resistance state in which the resistance value of the resistance variable layer is the high-resistance value $R_H$; and applying the electric pulse of the voltage V3 between the first electrode and the second electrode in the first high-resistance state or applying the electric pulse of the voltage V4 between the first electrode and the second electrode in the second high-resistance state to generate a low-resistance state in which the resistance value of the resistance variable layer is the low-resistance value $R_L$.

3. A reading method of the nonvolatile memory element, for reading data written according to the writing method of the nonvolatile memory element according to claim 2, comprising:

a first step for applying an electric pulse for a read voltage which is larger than the voltage V5 and smaller than the voltage V6 between the first electrode and the second electrode to determine whether the resistance state of the resistance variable layer is the high-resistance state in which the resistance value thereof is the high-resistance value $R_H$ or the low-resistance state;

a second step for applying the electric pulse of the voltage V4 between the first electrode and the second electrode when it is determined that the resistance state of the resistance variable layer is the high-resistance state in the first step; and a third step for applying the electric pulse for the read voltage between the first electrode and the second electrode to determine whether the resistance state of the resistance variable layer is the high-resistance state or the low-resistance state, after the second step.

4. The reading method according to claim 3, further comprising a fourth step for applying the electric pulse of the voltage V2 between the first electrode and the second electrode, when it is determined that the resistance state of the resistance variable layer is the low-resistance state in the third step.

5. A reading method of the nonvolatile memory element, for reading data written according to the writing method of the nonvolatile memory element according to claim 2, comprising:

a first step for applying an electric pulse for a read voltage which is larger than the voltage V5 and smaller than the voltage V6 between the first electrode and the second electrode to determine whether the resistance state of the resistance variable layer is the high-resistance state in which the resistance value thereof is the high-resistance value $R_H$ or the low-resistance state; and a step for applying the electric pulse for the read voltage between the first electrode and the second electrode and further applying an electric pulse of a voltage which is different in polarity from the read voltage and is equal in absolute value to the read voltage to determine whether the resistance state of the resistance variable layer is the first high-resistance state or the second high-resistance state, when it is determined that the resistance state of the resistance variable layer is the high-resistance state in the first step.

6. A nonvolatile semiconductor memory apparatus comprising:

a semiconductor substrate;

a plurality of memory cells including a plurality of word lines and a plurality of bit lines which are provided on the semiconductor substrate such that the word lines and the bit lines are arranged in matrix to cross each other, a plurality of transistors provided to respectively correspond to cross points between the plurality of word lines and the plurality of bit lines, and a plurality of nonvolatile memory elements according to claim 1 which are provided to respectively correspond to the plurality of transistors;

a row selection circuit for selecting one of the plurality of word lines;

a column selection circuit for selecting one of the plurality of bit lines;

a N-bit data input/output circuit which performs inputting and outputting data to and from an external part of the semiconductor substrate in a binary form of a high level or a low level;

a data encoding circuit for converting N-bit input data which is sent from the data input/output circuit into M ($2N \leq 3M$)-bit data expressing three values;

a reference voltage source connected to one terminal of the nonvolatile memory element;

a first voltage source which is connected to the other terminal of the nonvolatile memory element and writes a first high-resistance state in which the resistance value of the nonvolatile memory element is a high-resistance value $R_H$;

a second voltage source which is connected to the other terminal of the nonvolatile memory element and writes a second high-resistance state in which the resistance value of the nonvolatile memory element is a high-resistance value $R_H$;

a third voltage source which is connected to the other terminal of the nonvolatile memory element and writes a low-resistance state in which the resistance value of the nonvolatile memory element is a low-resistance value $R_L$;

a sense amplifier circuit configured to determine whether the resistance value of the nonvolatile memory element is higher or lower than a predetermined value; and a data decoding circuit for converting M-bit data expressing three values into N-bit binary data, to output write data for the memory cell through the data input/output circuit; wherein the N-bit input data are stored in M memory cells.

7. A reading method of the nonvolatile semiconductor memory apparatus according to claim 6, comprising:
- a first step for determining whether the resistance value of the selected memory cell is higher or lower than a predetermined value, using the sense amplifier;
- a second step for determining using the sense amplifier again whether the resistance value of the selected memory cell is higher or lower than the predetermined value after performing writing using the third voltage source, when it is determined that the resistance value is higher than the predetermined value in the first step;
- a third step for determining that the low-resistance state has been written in the selected memory cell when it is determined that the resistance value is lower than the predetermined value in the first step;
- a fourth step for determining that the first high-resistance state has been written in the selected memory cell when it is determined that the resistance value is lower than the predetermined value in the second step; and
- a fifth step for determining that the second high-resistance state has been written in the selected memory cell when it is determined that the resistance value is higher than the predetermined value in the second step.

8. The reading method of the nonvolatile semiconductor memory apparatus according to claim 7, wherein when it is determined that the resistance value is lower than the predetermined value in the second step, writing is performed using the first voltage source or the second voltage source so that the nonvolatile memory element becomes the resistance state in the first step.

9. A writing method of the nonvolatile semiconductor memory apparatus according to claim 6, comprising:
- a first step for writing to the selected memory cell using the first voltage source or the second voltage source to set the resistance state of the memory cell in a predetermined resistance state; and
- a second step for writing using the first voltage source, writing using the second voltage source, or writing using the third voltage source, after the first step.

10. The writing method according to claim 9, wherein when the resistance state set in the first step is identical to the resistance state to be written in the second step, the second step is not performed.

11. A nonvolatile semiconductor memory apparatus comprising:
- a semiconductor substrate; and
- a memory cell array including a plurality of first electrode wires provided to extend in parallel with each other on the semiconductor substrate, a plurality of second electrode wires which are provided above the plurality of first electrode wires and are arranged to extend in parallel with each other and to three-dimensionally cross the plurality of the first electrode wires within a plane parallel to a main surface of the semiconductor substrate, and nonvolatile memory elements according to claim 1 provided to respectively correspond to three-dimensional cross points between the plurality of first electrode wires and the plurality of second electrode wires.

12. The nonvolatile memory element according to claim 1, wherein the oxide of the metal element of the IV group, the V group or the VI group is an oxide which is selected from among Ti (titanium), V (vanadium), Zr (zircon), Nb (niobium), Hf (hafnium), Ta (tantalum) and W (tungsten).

13. The nonvolatile memory element according to claim 12, wherein the oxide of the metal element of the IV group, the V group or the VI group is a tantalum oxide which satisfies $0<x<2.5$ when the tantalum oxide is expressed as $TaO_x$.

14. A nonvolatile memory element comprising:
- N ($N \geq 3$) electrodes; and
- a resistance variable layer which intervenes between the electrodes, a resistance value of the resistance variable layer changing reversibly in response to electric signals applied between the electrodes;
- wherein the resistance variable layer is configured to include at least an oxide of a metal element of IV group, V group or VI group;
  - wherein when among voltages V1 to V6 of the electric pulses applied between the electrodes, the voltage V1, the voltage V4 and the voltage V6 are positive voltages and have a relationship V1>V4>V6, and the voltage V2, the voltage V3, and the voltage V5 are negative voltages and have a relationship V5>V3>V2,
  - (A) the resistance value of the resistance variable layer becomes a high-resistance value $R_H$ when the electric pulse of the voltage V1 is applied between the electrodes,
    thereafter the resistance value maintains the high-resistance value $R_H$ when an electric pulse of a positive voltage is applied between the electrodes, while the resistance value decreases when an electric pulse of a negative voltage which is smaller than the voltage V5 and larger than the voltage V3 is applied between the electrodes,
    the resistance value becomes a low-resistance value $R_L$ when the electric pulse of the voltage V3 is applied between the electrodes, then increases when an electric pulse of a negative voltage which is smaller than the voltage V3 and larger than the voltage V2 is applied between the electrodes or becomes the high-resistance value $R_H$ when the electric pulse of the voltage V2 is applied between the electrodes,
  - (B) after the electric pulse of the voltage V2 is applied between the electrodes, the resistance value maintains the high-resistance value $R_H$ when an electric pulse of a negative voltage is applied between the electrodes, while the resistance value decreases when an electric pulse of a positive voltage which is larger than the voltage V6 and smaller than the voltage V4 is applied between the electrodes,
    the resistance value becomes the low-resistance value $R_L$ when the electric pulse of the voltage V4 is applied between the electrodes, and then increases when an electric pulse of a positive voltage which is larger than the voltage V4 and smaller than the voltage V1 is applied between the electrodes, or becomes the high-resistance value $R_H$ when the electric pulse of the voltage V1 is applied between the electrodes.

15. A writing method of the nonvolatile memory element according to claim 14, comprising the steps of:
- applying the electric pulse of the voltage V1 between the electrodes to generate a first high-resistance state in which the resistance value of the resistance variable layer is the high-resistance value $R_H$;
- applying the electric pulse of the voltage V2 between the electrodes to generate a second high-resistance state in which the resistance value of the resistance variable layer is the high-resistance value $R_H$; and
- applying the electric pulse of the voltage V3 between the electrodes in the first high-resistance state or applying the electric pulse of the voltage V4 between the electrodes in the second high-resistance state, to generate the low-resistance state in which the resistance value of the resistance variable layer is the low-resistance value $R_L$.

* * * * *